United States Patent
Wang et al.

(10) Patent No.: US 12,166,142 B1
(45) Date of Patent: Dec. 10, 2024

(54) SOLAR CELL, METHOD FOR PREPARING THE SAME, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Zhao Wang, Zhejiang (CN); Jie Yang, Zhejiang (CN); Peiting Zheng, Zhejiang (CN); Xinyu Zhang, Zhejiang (CN); Mengchao Shen, Zhejiang (CN); Jie Mao, Zhejiang (CN); Jiajia Zhu, Zhejiang (CN); Jingming Zheng, Zhejiang (CN)

(73) Assignees: ZHEJIANG JINKO SOLAR CO., LTD., Haining Zhejiang (CN); JINKO SOLAR CO., LTD., Jiangxi (CN)

(*) Notice: Subject to any disclaimer, the term of this patent is extended or adjusted under 35 U.S.C. 154(b) by 0 days.

(21) Appl. No.: 18/424,563

(22) Filed: Jan. 26, 2024

(30) Foreign Application Priority Data

Dec. 15, 2023 (CN) .......................... 202311736451.7

(51) Int. Cl.
*H01L 31/068* (2012.01)
*H01L 31/0216* (2014.01)
*H01L 31/0236* (2006.01)

(52) U.S. Cl.
CPC ...... *H01L 31/068* (2013.01); *H01L 31/02168* (2013.01); *H01L 31/02363* (2013.01); *H01L 31/0682* (2013.01)

(58) Field of Classification Search
CPC ............. H01L 31/068; H01L 31/02168; H01L 31/02363; H01L 31/0682
See application file for complete search history.

(56) References Cited

U.S. PATENT DOCUMENTS

| 6,114,046 | A  | 9/2000  | Hanoka           |
|-----------|----|---------|------------------|
| 9,525,083 | B2 | 12/2016 | Westerberg et al.|

(Continued)

FOREIGN PATENT DOCUMENTS

| AU | 2022206808 B1 | 11/2023 |
| AU | 2023258335 A1 | 11/2023 |

(Continued)

OTHER PUBLICATIONS

English machine translation of WO-2015141326-A1 (Year: 2024).*

(Continued)

*Primary Examiner* — Angelo Trivisonno
(74) *Attorney, Agent, or Firm* — USCH Law, PC

(57) ABSTRACT

A solar cell is provided, including a substrate having a rear surface including P-type regions and N-type regions, first dielectric layers each formed over a N-type region, first doped polysilicon layers each formed on a first dielectric layer and doped with an N-type doping element, second dielectric layers each formed over a P-type region, second doped polysilicon layers each formed on a second dielectric layer and doped with a P-type doping element, a passivation layer formed over surfaces of the first and second doped polysilicon layers, and first and second electrodes penetrating the passivation layer. Each first electrode is electrically connected to a first doped polysilicon layer and each second electrode is electrically connected to a second doped polysilicon layer. A first roughness of a surface of a first doped polysilicon layer is greater than a second roughness of a surface of a second doped polysilicon layer.

20 Claims, 6 Drawing Sheets

(56) References Cited

U.S. PATENT DOCUMENTS

| | | |
|---|---|---|
| 11,848,397 B1 | 12/2023 | Jin et al. |
| 2009/0308438 A1 | 12/2009 | De Ceuster et al. |
| 2013/0130508 A1 | 5/2013 | Wu et al. |
| 2013/0295712 A1 | 11/2013 | Chen et al. |
| 2014/0299187 A1 | 10/2014 | Chang et al. |
| 2017/0200850 A1 | 7/2017 | Lee et al. |
| 2018/0315866 A1 | 11/2018 | Cheong et al. |
| 2019/0267499 A1 | 8/2019 | Smith et al. |
| 2020/0135944 A1 | 4/2020 | Yi et al. |
| 2020/0287066 A1 | 9/2020 | Stodolny et al. |
| 2022/0262967 A1 | 8/2022 | Kim et al. |
| 2022/0376124 A1 | 11/2022 | Feng et al. |
| 2023/0037129 A1 | 2/2023 | Prusik et al. |
| 2023/0187564 A1 | 6/2023 | Jin et al. |
| 2023/0402553 A1 | 12/2023 | Chen et al. |

FOREIGN PATENT DOCUMENTS

| | | | |
|---|---|---|---|
| CN | 206595264 U | 10/2017 | |
| CN | 108336154 A | 7/2018 | |
| CN | 110676160 A | 1/2020 | |
| CN | 111739984 A | 10/2020 | |
| CN | 111755552 A | 10/2020 | |
| CN | 113327999 A | 8/2021 | |
| CN | 114388639 A | 4/2022 | |
| CN | 114784148 A | 7/2022 | |
| CN | 115566088 A | 1/2023 | |
| CN | 218585994 U | 3/2023 | |
| CN | 218975458 U | 5/2023 | |
| CN | 116632093 A | 8/2023 | |
| CN | 116741849 A | 9/2023 | |
| EP | 4290588 A1 | 12/2023 | |
| JP | 2005142268 A | 6/2005 | |
| JP | 2015082512 A | 4/2015 | |
| JP | 2015515747 A | 5/2015 | |
| JP | 2015149500 A | 8/2015 | |
| JP | 2015185587 A | 10/2015 | |
| JP | 2016006907 A | 1/2016 | |
| JP | 2016012687 A | 1/2016 | |
| JP | 2016139834 A | 8/2016 | |
| JP | 2016225627 A | 12/2016 | |
| JP | 2017120906 A | 7/2017 | |
| JP | 2017520920 A | 7/2017 | |
| JP | 2018026574 A | 2/2018 | |
| JP | 2018107480 A | 7/2018 | |
| JP | 2018129511 A | 8/2018 | |
| JP | 2019220725 A | 12/2019 | |
| JP | 2020043255 A | 3/2020 | |
| JP | 2020129666 A | 8/2020 | |
| JP | 2022501837 A | 1/2022 | |
| JP | 2022058069 A | 4/2022 | |
| JP | 7381687 B1 | 11/2023 | |
| JP | 2023174428 A | 12/2023 | |
| KR | 101740523 B1 | 5/2017 | |
| KR | 101930640 B1 | 12/2018 | |
| WO | WO-2015141326 A1 * | 9/2015 | ..... H01L 31/022441 |
| WO | 2017163520 A1 | 9/2017 | |
| WO | 2019116031 A1 | 6/2019 | |
| WO | 2019163646 A1 | 8/2019 | |

OTHER PUBLICATIONS

Andrea Ingenito, et al., "Silicon Solar Cell Architecture with Front Selective and Rear Full Area Ion-Implanted Passivating Contacts", Solar RRL, 2017, vol. 1, Article No. 1700040, 6 pgs.

Zhejiang Jinko Solar Co., Ltd., et al., Non Final Rejection, U.S. Appl. No. 18/582,627, Jun. 13, 2024, 26 pgs.

Zhejiang Jinko Solar Co., LTD., et al., Extended European Search Report, EP 24153724.0, Aug. 16, 2024, 7 pgs.

Zhejiang Jinko Solar Co., LTD., et al., Non-Final Rejection, U.S. Appl. No. 18/593,812, Sep. 10, 2024, 35 pgs.

Zhejiang Jinko Solar Co., LTD., et al., Extended European Search Report, EP 24160410.7, Jul. 23, 2024, 9 pgs.

Zhejiang Jinko Solar Co., LTD., et al., Final-Rejection, U.S. Appl. No. 18/582,627, Sep. 27, 2024, 35 pgs.

Zhejiang Jinko Solar Co., LTD., et al., Extended European Search Report, EP 24159209.6, Aug. 19, 2024, 73 pgs.

Zhejiang Jinko Solar Co., LTD., et al., Extended European Search Report, EP 24170779.3, Oct. 4, 2024, 40 pgs.

* cited by examiner

SOLAR CELL, METHOD FOR PREPARING THE SAME, AND PHOTOVOLTAIC MODULE

CROSS-REFERENCE TO RELATED APPLICATION

The present application claims the benefit of priority under the Paris Convention to Chinese Patent Application 202311736451.7 filed on Dec. 15, 2023, which is incorporated herein by reference in its entirety.

TECHNICAL FIELD

Embodiments of the present disclosure relate in general to the field of solar cells, and in particular to a solar cell, a method for preparing the solar cell, and a photovoltaic module.

BACKGROUND

Currently, with gradual depletion of fossil energy sources, solar cells are being used more and more widely as a new energy alternative, which convert light energy from the sun into electrical energy. The solar cells utilize the photovoltaic principle to generate carriers, and then use electrodes to draw the carriers out, thereby facilitating efficient utilization of the electrical energy.

Conventional solar cells mainly include interdigitated back contact (IBC) cells, tunnel oxide passivated contact (TOPCON) cells, passivated emitter and rear cells (PERC), and heterojunction cells, etc. The photovoltaic conversion efficiency of the solar cell is improved by reducing optical losses and photogenerated carrier recombination on a surface and in a body of a silicon substrate through configuration of different layers and functional limitations.

However, the photovoltaic conversion efficiency of the conventional solar cell is still poor.

SUMMARY

Some embodiments of the present disclosure provide a solar cell, a method for preparing the solar cell, and a photovoltaic module, which are at least conducive to photoelectric conversion efficiency of the solar cell.

Some embodiments of the present disclosure provide a solar cell, including: a substrate having a front surface and a rear surface opposite to each other, where the rear surface includes P-type regions and N-type regions which are spaced from each other and alternatingly arranged; first dielectric layers, where each of the first dielectric layers is formed over a respective N-type region of the N-type regions; first doped polysilicon layers, where each of the first doped polysilicon layers is formed on a respective first dielectric layer of the first dielectric layers and doped with an N-type doping element; second dielectric layers, where each of the second dielectric layers is formed over a respective P-type region of the P-type regions; second doped polysilicon layers, where each of the second doped polysilicon layers is formed on a respective second dielectric layer of the second dielectric layers and doped with a P-type doping element, and where each of the first doped polysilicon layers has a surface facing away from the substrate and having a first roughness, each of the second doped polysilicon layers has a surface facing away from the substrate and having a second roughness, and the second roughness is less than the first roughness; a passivation layer formed over surfaces of the first doped polysilicon layers facing away from the substrate and surfaces of the second doped polysilicon layers facing away from the substrate; and first electrodes and second electrodes, where each of the first electrodes penetrates the passivation layer and is electrically connected to a respective first doped polysilicon layer, and each of the second electrodes penetrates the passivation layer and is electrically connected to a respective second doped polysilicon layer.

In some embodiments, the respective first doped polysilicon layer includes a plurality of first silicon grains, and surfaces of the plurality of first silicon grains form a surface of the respective first doped polysilicon layer having the first roughness; where the respective second doped polysilicon layer includes a plurality of second silicon grains, and surfaces of the plurality of second silicon grains form a surface of the respective second doped polysilicon layer having the second roughness; and where each of the plurality of first silicon grains has a grain size that is less than a grain size of any of the plurality of second silicon grains.

In some embodiments, the grain size of each of the plurality of first silicon grains is in a range of 10 nm to 300 nm.

In some embodiments, the grain size of each of the plurality of second silicon grains is in a range of 100 nm to 900 nm.

In some embodiments, the plurality of first silicon grains have spherical granular shapes or spheroidal granular shapes.

In some embodiments, the plurality of second silicon grains have sheet shapes, plate shapes, or granular shapes.

In some embodiments, each of the plurality of first silicon grains has a radial one-dimensional size that is less than a radial one-dimensional size of any of the plurality of the second silicon grains, and each of the plurality of first silicon grains has a height that is greater than a height of any of the plurality of second silicon grains.

In some embodiments, the rear surface further includes non-electrode regions each provided between a respective P-type region and a respective N-type region that are adjacent to each other, and the passivation layer is formed over the non-electrode regions; where the rear surface has first surface structures in the N-type regions, and the first dielectric layers formed on the first surface structures; and where the rear surface has second surface structures at the non-electrode regions, and the passivation layer is formed on the second surface structures.

In some embodiments, the rear surface further includes non-electrode regions each provided between a respective P-type region and a respective N-type region that are adjacent to each other, and the passivation layer is formed over the non-electrode regions; where the rear surface has first surface structures in the P-type regions, and the second dielectric layers formed on the first surface structures; and where the rear surface has second surface structures in the non-electrode regions, and the passivation layer is formed on the second surface structures.

In some embodiments, a respective one of the first surface structures and the front surface have a first minimum distance, a respective one of the second surface structures and the front surface have a second minimum distance, and the first minimum distance is less than the second minimum distance.

In some embodiments, the first minimum distance and the second minimum distance have a difference in a range of 0.5 μm to 10 μm.

In some embodiments, the rear surface further has third surface structures each located at a junction of the respective P-type region and a respective non-electrode region of the non-electrode regions or a junction of the respective N-type region and the respective non-electrode region; where some of the third surface structures include a first side surface and a second side surface, the first side surface faces away from the respective non-electrode region, and the second side surface faces the respective non-electrode region; and where the first side surface has a radial length that is less than a radial length of the second side surface.

In some embodiments, the third surface structures include prism structures, pyramid structures, or tetrahedral structures.

In some embodiments, the first surface structures include platform protrusion structures, pyramid textured structures, or flat surfaces.

In some embodiments, the respective first doped polysilicon layer has an average thickness that is less than or equal to an average thickness of the respective second doped polysilicon layer.

In some embodiments, at least one of a respective one of the first dielectric layers and a respective one of the second dielectric layers includes silicon oxide, amorphous silicon, microcrystalline silicon, nanocrystalline silicon or silicon carbide.

Some embodiments of the present disclosure further provide a method for preparing a solar cell including: providing a substrate having a front surface and a rear surface opposite to each other, where the rear surface includes P-type regions and N-type regions which are spaced from each other and alternatingly arranged; forming first dielectric layers, where each of the first dielectric layers is formed over a respective N-type region of the N-type regions; forming first doped polysilicon layers, where each of the first doped polysilicon layers is formed on a respective first dielectric layer of the first dielectric layers and doped with a N-type doping element; forming second dielectric layers, where each of the second dielectric layers is formed over a respective P-type region of the P-type regions; forming second doped polysilicon layers, where each of the second doped polysilicon layers is formed on a respective second dielectric layer of the second dielectric layers and doped with a P-type doping element, and where each of the first doped polysilicon layers has a surface facing away from the substrate and having a first roughness, each of the second doped polysilicon layers has a surface facing away from the substrate and having a second roughness, and the second roughness is less than the first roughness; forming a passivation layer over surfaces of the first doped polysilicon layers facing away from the substrate and surfaces of the second doped polysilicon layers facing away from the substrate; and forming first electrodes and second electrodes, where each of the first electrodes penetrates the passivation layer and is electrically connected to a respective first doped polysilicon layer, and each of the second electrodes penetrates the passivation layer and is electrically connected to a respective second doped polysilicon layer.

Some embodiments of the present disclosure further provide a photovoltaic module including: at least one cell string each formed by connecting a plurality of solar cells according to any one of the above embodiments or a plurality of solar cells prepared by the method any one of the above embodiments through at least one connecting member; at least one encapsulation layer each configured to cover a surface of a respective cell string; and at least one cover plate each configured to cover a surface of a respective encapsulating adhesive film facing away from the respective cell string.

BRIEF DESCRIPTION OF THE DRAWINGS

One or more embodiments are exemplarily described with figures in the accompanying drawings corresponding thereto, which are not intended to limit these embodiments. Unless otherwise stated, the figures in the accompanying drawings do not constitute scale limitations. In order to more clearly illustrate the technical solutions in the embodiments of the present disclosure or conventional technologies, the accompanying drawings that need to be used in the embodiments are briefly described below, and it is apparent that the drawings in the following description are merely some embodiments of the present disclosure. For a person of ordinary skill in the art, other drawings may also be obtained according to these drawings.

DETAILED DESCRIPTION OF THE EMBODIMENTS

It is seen from the background that the photoelectric conversion efficiency of the conventional solar cell is poor.

The solar cell provided in the embodiments of the present disclosure includes first doped polysilicon layers and second doped polysilicon layers formed over the rear surface, such a fully-passivated contact cell structure greatly reduces recombination current of the cell and improves open-circuit voltage of the cell. In addition, the process of preparing the fully-passivated contact cell uses the first doped polysilicon layers and the second doped polysilicon layers as carrier transport layers without the design of a high-temperature diffusion layer, which removes the influence of the recombination current of the diffusion layer, and improves the open-circuit voltage of the cell. The first doped polysilicon layers are doped with N-type doping elements, and a surface of a first doped polysilicon layer has a first roughness. The second doped polysilicon layers are doped with P-type doping elements, and a surface of a second doped polysilicon layer has a second roughness. The second roughness is less than the first roughness. In this way, the first doped polysilicon layer and the second doped polysilicon layer have different morphologies, and for the first doped polysilicon layer with higher roughness, the surface of the first doped polysilicon layer improves internal reflection of incident light and reduces optical loss of the solar cell. The first doped polysilicon layer further improves a contact area between the first electrode and the first doped polysilicon layer, thereby improving contact performance and welding tension of the first doped polysilicon layer. For the second doped polysilicon layer with lower roughness, the surface of the second doped polysilicon layer is smooth, uniformity of the second passivation layer deposited on the second doped polysilicon layer is good, and passivation performance of the second passivation layer is good, so that the problem of recombination defects of the solar cell is improved.

Embodiments of the present disclosure will be described in detail below with reference to the accompanying drawings. Those of ordinary skill in the art may understand that in the embodiments of the present disclosure, many technical details are set forth in order to make the reader better understand the present disclosure. The technical solutions set forth in the present disclosure may be implemented even without these technical details and various changes and modifications based on the following embodiments.

Figure 1:
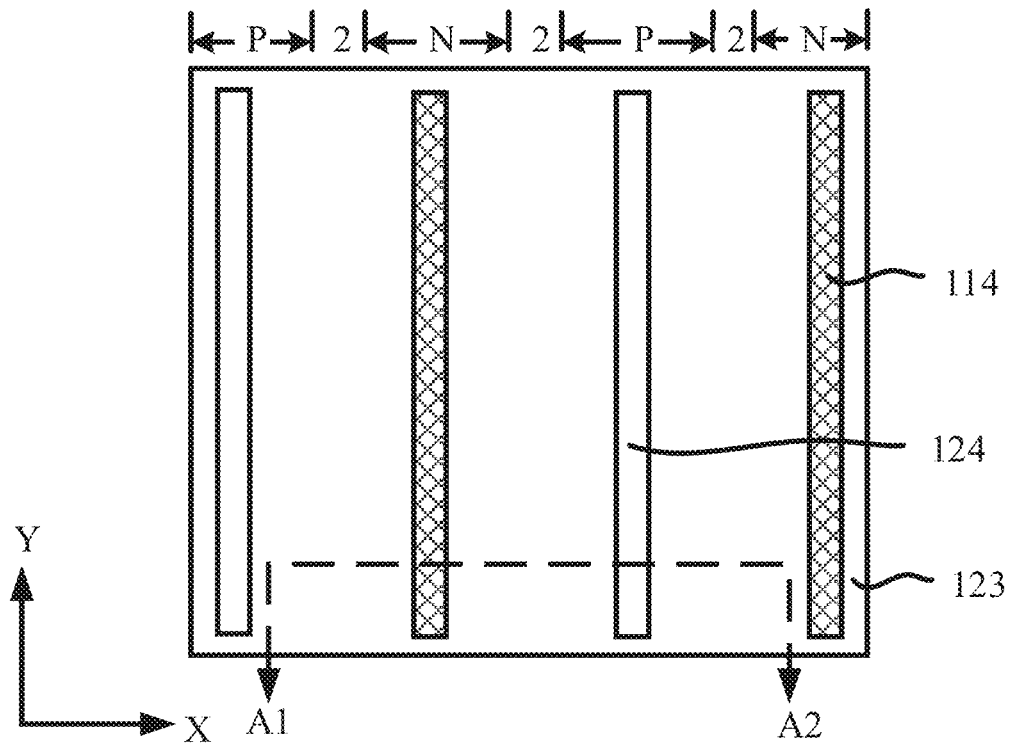
FIG. 1 is a schematic structural diagram of a solar cell according to an embodiment of the present disclosure.
Figure 2:
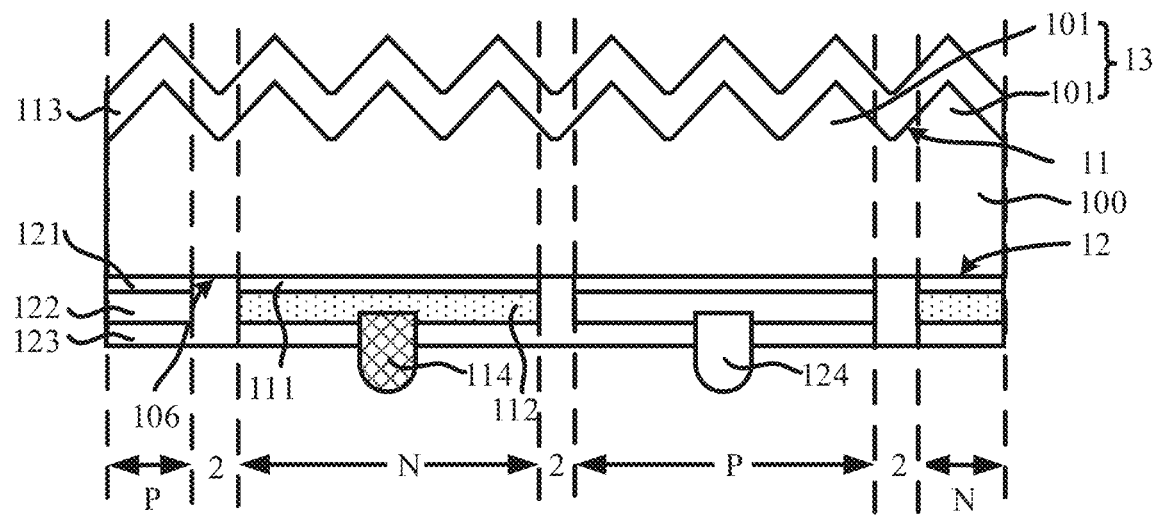
FIG. 2 is a cross-sectional view of FIG. 1 along section line A1-A2.
Figure 3:
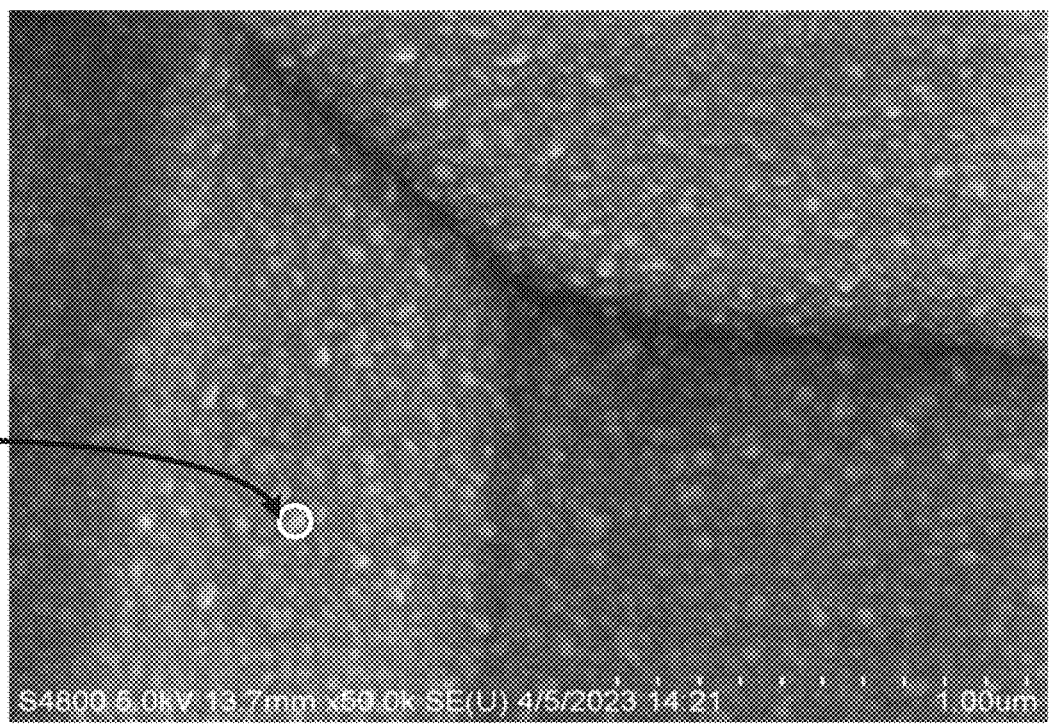
FIG. 3 is a scanning electron microscope image of a first doped polysilicon layer in a solar cell according to an embodiment of the present disclosure.
Figure 4:
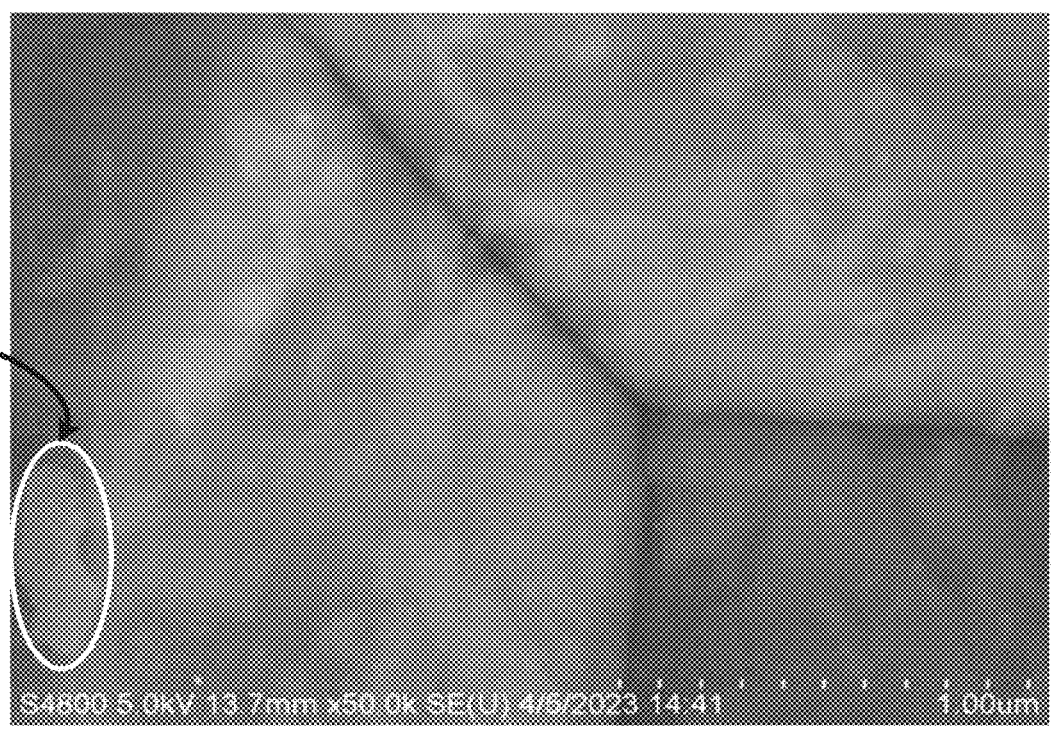
FIG. 4 is a scanning electron microscope image of a second doped polysilicon layer in a solar cell according to an embodiment of the present disclosure.

FIG. 1 is a schematic structural diagram of a solar cell according to an embodiment of the present disclosure. FIG. 2 is a cross-sectional view of FIG. 1 along section line A1-A2. FIG. 3 is a scanning electron microscope image of a first doped polysilicon layer in a solar cell according to an embodiment of the present disclosure. FIG. 4 is a scanning electron microscope image of a second doped polysilicon layer in a solar cell according to an embodiment of the present disclosure.

Referring to FIG. 1 and FIG. 2, some embodiments of the present disclosure provide a solar cell for improving photoelectric conversion efficiency. The solar cell includes a substrate 100 having a front surface 11 and a rear surface 12 disposed opposite to each other.

In some embodiments, a material of the substrate 100 includes an elemental semiconductor material. Specifically, the elemental semiconductor material is composed of a single element, for example, silicon or germanium. The elemental semiconductor material may be in a single crystal state, a polycrystalline state, an amorphous state, or a microcrystalline state (i.e., having the single crystal state and the amorphous state at the same time). For example, silicon may be at least one of single crystalline silicon, polysilicon, amorphous silicon, or microcrystalline silicon.

In some embodiments, the material of the substrate 100 includes a compound semiconductor material. Conventional compound semiconductor materials include, but are not limited to, silicon germanium, silicon carbide, gallium arsenide, indium gallium arsenide, perovskite, cadmium telluride, copper indium selenium and other materials. The substrate 100 may also be a sapphire substrate, a silicon substrate on an insulator, or a germanium substrate on the insulator.

In some embodiments, the substrate 100 may be an N-type semiconductor substrate or a P-type semiconductor substrate. The N-type semiconductor substrate is doped with an N-type doping element, and the N-type doping element may be any one of group V elements such as phosphorus (P), bismuth (Bi), antimony (Sb), or arsenic (As). The P-type semiconductor substrate is doped with a P-type doping element, and the P-type doping element may be any one of group III elements such as boron (B), aluminum (Al), gallium (Ga), or indium (In).

In some embodiments, the front surface 11 is a light receiving surface for receiving incident light, and the rear surface 12 is a backlight surface. In some embodiments, the solar cell is a double-sided cell, that is, both the front surface and the rear surface of the substrate are light receiving surfaces for receiving incident light. The backlight surface is also capable of receiving incident light, but the efficiency of receiving the incident light from the backlight surface is weaker than the efficiency of receiving the incident light from the light receiving surface.

In some embodiments, the substrate 100 has P-type regions and N-type regions spaced from each other and alternatingly arranged.

In some embodiments, the front surface 11 of the substrate 100 has a textured structure 13, and the textured structure 13 includes a regular-shaped pyramid textured structure and an irregular-shaped black silicon. An inclined surface of the textured structure can increase internal reflection of incident light, thereby improving the absorption and utilization rate of the substrate on incident light, and further improving the cell efficiency of the solar cell.

In some embodiments, the textured structure 13 includes a plurality of protrusion structures 101, and shapes of the protrusion structures 101 include pyramid shapes, parabolic shapes, or elliptical spherical shapes.

In some embodiments, the front surface 11 of the substrate has a front surface field (FSF) in which doped ions have a conductivity type the same as a conductivity type of doped ions in the substrate, and surface minority concentration is reduced by using the field passivation effect, so that a surface recombination rate is reduced, meanwhile, a series resistance is reduced, and electron transmission capability is improved.

In some embodiments, the rear surface 12 of the substrate is a polishing surface, and the polishing surface refers to a flat surface formed by polishing solution or laser etching to remove the textured structure of the surface. After polishing, flatness of the rear surface is increased, reflection of long-wave light is increased, and secondary absorption of projection light is promoted, thereby improving a short-circuit current. Meanwhile, due to reduction of a specific surface area of the rear surface, recombination on the rear surface is reduced, and the passivation effect of the rear surface is improved.

In some embodiments, the rear surface includes non-electrode regions 2 each provided between a respective one of the P-type regions and a respective one of the N-type regions adjacent to the P-type region, and the passivation layer is formed over the non-electrode regions 2. A trench 106 is formed between the P-type region and the N-type region adjacent to each other, so as to achieve automatic isolation between regions of different conductive types, which avoids heavily doped P-type regions and N-type regions of the rear surface of the IBC cell from forming tunnel junctions to cause electric leakage to affect the cell efficiency.

The solar cell includes first dielectric layers 111 and first doped polysilicon layers 112. Each of the first dielectric layers 111 is formed over a respective one of the N-type regions of the rear surface, and each of the first doped polysilicon layers 112 is formed on a respective one of the first dielectric layers 111 and doped with an N-type doping element.

In some embodiments, a material of a first dielectric layer 111 includes silicon oxide, amorphous silicon, microcrystalline silicon, nanocrystalline silicon, or silicon carbide.

In some embodiments, the first dielectric layer 111 includes a first tunneling dielectric layer, and a passivation contact structure is formed between the first tunneling dielectric layer and the first doped polysilicon layer 112. The first doped polysilicon layer 112 is able to form band bending on the surface of the substrate 100, and the first tunneling dielectric layer causes an asymmetric shift of the band on the surface of the substrate 100 such that potential barrier for the majority carriers is lower than potential barrier for the minority carriers, therefore the majority carriers can pass through the first tunneling dielectric layer for quantum tunneling more easily, while the minority carriers have difficulty in passing through the first tunneling dielectric layer, so as to achieve selective transport of carriers.

In addition, the first tunneling dielectric layer has a chemical passivation effect. Specifically, as interface state defects exist at an interface of the substrate 100 and the first tunneling dielectric layer, interface state density of the rear surface of the substrate 100 is large, the increase of the interface state density promotes recombination of photon-generated carriers, and increases the filling factor, the short-circuit current and the open-circuit voltage of the solar cell, so that the photoelectric conversion efficiency of the solar cell is improved. The first tunneling dielectric layer is provided on the rear surface 12 of the substrate 100, so that the first tunneling dielectric layer has the chemical passivation effect on the rear surface of the substrate 100. Specifically, the defect state density of the substrate 100 is reduced by saturating dangling bonds of the substrate 100, and the carrier recombination rate is reduced by reducing the recombination center of the substrate 100.

The first doped polysilicon layer 112 has a field passivation effect. Specifically, an electrostatic field directed to the interior of the substrate 100 is formed on the surface of the substrate 100 to enable minority carriers to escape from the interface, so that concentration of the minority carriers is reduced, the carrier recombination rate at the interface of the substrate 100 is reduced, the open-circuit voltage, the short-circuit current and the filling factor of the solar cell are increased, and the photoelectric conversion efficiency of the solar cell is improved.

The first doped polysilicon layer 112 is doped with the doping element of the same type as the doping element in the substrate 100, for example, the type of the doping element in the substrate 100 is N-type.

A concentration of the doping element in the first doped polysilicon layer 112 is greater than a concentration of the doping element in the substrate 100, so as to form a sufficiently high potential barrier on the surface of the substrate 100, so that the majority carriers in the substrate 100 are able to pass through the first tunneling dielectric layer to the first doped polysilicon layer 112.

In some embodiments, the first doped polysilicon layer 112 is doped with the doping element of a conductivity type different from the doping element in the substrate 100. For example, the type of the doping element in the substrate 100 is P-type, and the type of the doping element in the first doped polysilicon layer 112 is N-type. In this way, a PN junction is constructed between the first doped polysilicon layer 112 and the substrate 100, and new hole-electron pairs are formed by the sun shining on the PN junction. The photo-generated holes flow to the P-type region under the action of a built-in electric field of the P-N junction, the photo-generated electrons flow to the N-type region, and a current is generated after the circuit is connected.

In some embodiments, a thickness of the first tunneling dielectric layer is in a range of 0.5 nm to 5 nm. The thickness of the first tunneling dielectric layer is in a range of 0.5 nm to 1.3 nm, 1.3 nm to 2.6 nm, 2.6 nm to 4.1 nm, or 4.1 nm to 5 nm. If the first tunneling dielectric layer is within any of the above ranges, the thickness of the first tunneling dielectric layer is relatively small, so that the majority carriers can pass through the first tunneling dielectric layer more easily for quantum tunneling, and the minority carriers have difficulty in passing through the first tunneling dielectric layer, so as to realize selective transmission of carriers.

Referring to FIG. 3, the first doped polysilicon layer 112 includes a plurality of first silicon grains 1121, and surfaces of the plurality of first silicon grains 1121 form a surface of the first doped polysilicon layer 112 having a first roughness.

It should be noted that in the process of forming the first doped polysilicon layer 112, silicon atoms are arranged in the form of a diamond lattice to form a plurality of crystal nucleuses, the crystal nucleuses grow into grains having crystal planes with different orientations, and the grains are combined to crystallize into polysilicon. The first silicon grains refer to grains having crystal planes with different orientations which constitute the polysilicon.

From the scanning electron microscope image shown in FIG. 3, a surface morphology of the first doped polysilicon layer 112 is directly seen, the first doped polysilicon layer 112 includes the plurality of first silicon grains 1121, surfaces of the plurality of first silicon grains 1121 are uneven so as to construct an uneven surface of the first doped polysilicon layer 112, so the surface of the first doped polysilicon layer 112 has the first roughness.

In some embodiments, a grain size of a first silicon grain 1121 is in a range of 10 nm to 300 nm. The grain size of the first silicon grain is in a range of 10 nm to 53 nm, 53 nm to 95.3 nm, 95.3 nm to 138.2 nm, 138.2 nm to 200.6 nm, 200.6 nm to 248 nm, or 248 nm to 300 nm. The grain size of the first silicon grain 1121 is within any of the above ranges, so that the roughness of the surface formed by surfaces of the first silicon grains 1121 is large. The grain size of the first silicon grain 1121 is within any of the above ranges, the stability between the first silicon grain 1121 and the first silicon grain 1121 is good, and the first doped polysilicon layer 112 is not prone to deformation of the crystal state. In addition, if the grain size of the first silicon grain 1121 is within any of the above ranges, the stress of the first doped polysilicon layer 112 on the first dielectric layer 111 and a first passivation layer is small, so that film layer performance between the first doped polysilicon layer 112 and the first dielectric layer 111 and between the first doped polysilicon layer 112 and the first passivation layer is improved.

In some embodiments, the shape of the first silicon grain 1121 includes a granular shape. Compared with a block-shaped structure, grain boundaries between granular structures are few, and space between the grain boundaries is large. The N-type doping element in the first doped polysilicon layer 112 can migrate through the space between the grain boundaries and is finally collected by the first electrode.

In some embodiments, the granular shape includes a spherical granular shape or a spheroidal granular shape.

It should be noted that the shape of the first silicon grain as well as a shape of a second silicon grain in the following description is observed by an electrical microscope or an optical microscope, etc., with magnification, and the electrical microscope may include a scanning electron microscope (SEM) or an atomic force microscope (AFM) of conventional testing means. FIG. 3 is a micrograph of a first silicon grain shown by the scanning electrical microscope, and it is seen that the first silicon grain has a granular shape with the same length in three dimensions. FIG. 4 is a micrograph of a second silicon grain shown by the scanning electrical microscope, and it is seen that the second silicon grain has a sheet shape extending in two dimensions.

With reference to FIG. 2, the solar cell further includes second dielectric layers 121 and second doped polysilicon layers 122. Each of the second dielectric layers 121 is formed over a respective one of the P-type regions of the rear surface, and each of the second doped polysilicon layers 122 is formed on a respective one of the second dielectric layers 121. The second doped polysilicon layer 122 is doped with a P-type doping element. A surface of the first doped polysilicon layer 112 facing away from the substrate 100 has a first roughness, a surface of the second doped polysilicon layer 122 facing away from the substrate 100 has a second roughness, and the second roughness is less than the first roughness.

In some embodiments, a material of the second dielectric layer 122 includes silicon oxide, amorphous silicon, microcrystalline silicon, nanocrystalline silicon, or silicon carbide.

In some embodiments, the second dielectric layer 121 includes a second tunneling dielectric layer, and a passivation contact structure is formed between the second tunneling dielectric layer and the second doped polysilicon layer 122. The second doped polysilicon layer 122 is able to form band bending on the surface of the substrate 100, and the second tunneling dielectric layer causes an asymmetric shift of the band on the surface of the substrate 100 such that potential barrier for the majority carriers is lower than potential barrier for the minority carriers, therefore the majority carriers can pass through the second tunneling dielectric layer for quantum tunneling more easily, while the minority carriers have difficulty in passing through the second tunneling dielectric layer, so as to achieve selective transport of carriers.

In addition, the second tunneling dielectric layer has a chemical passivation effect. Specifically, as interface state defects exist at an interface of the substrate 100 and the second tunneling dielectric layer, interface state density of the rear surface of the substrate 100 is large, the increase of the interface state density promotes recombination of photon-generated carriers, and increases the filling factor, the short-circuit current and the open-circuit voltage of the solar cell, so that the photoelectric conversion efficiency of the solar cell is improved. The second tunneling dielectric layer is provided on the rear surface 12 of the substrate 100, so that the second tunneling dielectric layer has the chemical passivation effect on the rear surface of the substrate 100. Specifically, the defect state density of the substrate 100 is reduced by saturating dangling bonds of the substrate 100, and the carrier recombination rate is reduced by reducing the recombination center of the substrate 100.

The second doped polysilicon layer 122 has a field passivation effect. Specifically, an electrostatic field directed to the interior of the substrate 100 is formed on the surface of the substrate 100 to enable minority carriers to escape from the interface, so that concentration of the minority carriers is reduced, the carrier recombination rate at the interface of the substrate 100 is reduced, the open-circuit voltage, the short-circuit current and the filling factor of the solar cell are increased, and the photoelectric conversion efficiency of the solar cell is improved.

The second doped polysilicon layer 122 is doped with the doping element of the same type as the doping element in the substrate 100, for example, the type of the doping element in the substrate 100 is P-type.

A concentration of the doping element in the second doped polysilicon layer 122 is greater than a concentration of the doping element in the substrate 100, so as to form a sufficiently high potential barrier on the surface of the substrate 100, so that the majority carriers in the substrate 100 are able to pass through the second tunneling dielectric layer to the second doped polysilicon layer 122.

In some embodiments, a thickness of the second tunneling dielectric layer is in a range of 0.5 nm to 5 nm. The thickness of the second tunneling dielectric layer is in a range of 0.5 nm to 1.3 nm, 1.3 nm to 2.6 nm, 2.6 nm to 4.1 nm, or 4.1 nm to 5 nm. If the second tunneling dielectric layer is within any of the above ranges, the thickness of the second tunneling dielectric layer is relatively small, so that the majority carriers can pass through the second tunneling dielectric layer more easily for quantum tunneling, and the minority carriers have difficulty in passing through the second tunneling dielectric layer, so as to realize selective transmission of carriers.

For the solar cell shown in FIG. 2, in some embodiments, the first doped polysilicon layer 112 is doped with the doping element of a conductivity type that is different from a conductivity type of the doping element in the substrate, a PN junction is formed between the first doped polysilicon layer 112 and the substrate, and the first doped polysilicon layer 112 serves as an emitter. In some embodiments, the second doped polysilicon layer 122 is doped with the doping element of a conductivity type that is different from the conductivity type of the doping element in the substrate, a PN junction is formed between the second doped polysilicon layer 122 and the substrate, and the second doped polysilicon layer 122 serves as the emitter.

Figure 5:
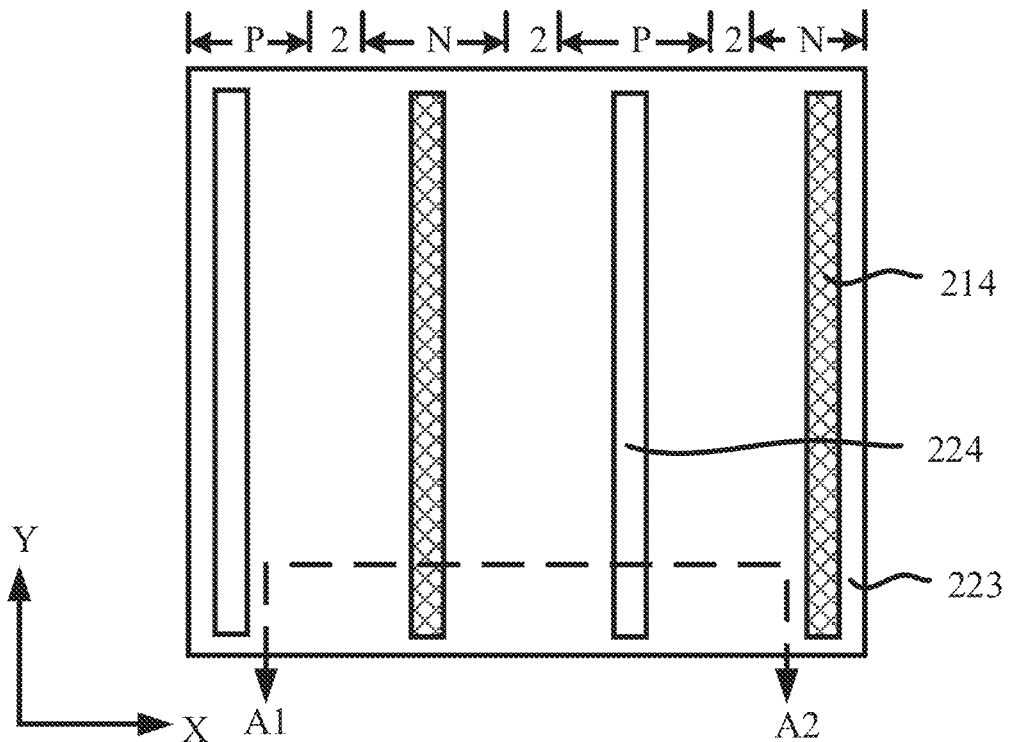
FIG. 5 is another schematic structural diagram of a solar cell according to an embodiment of the present disclosure.
Figure 6:
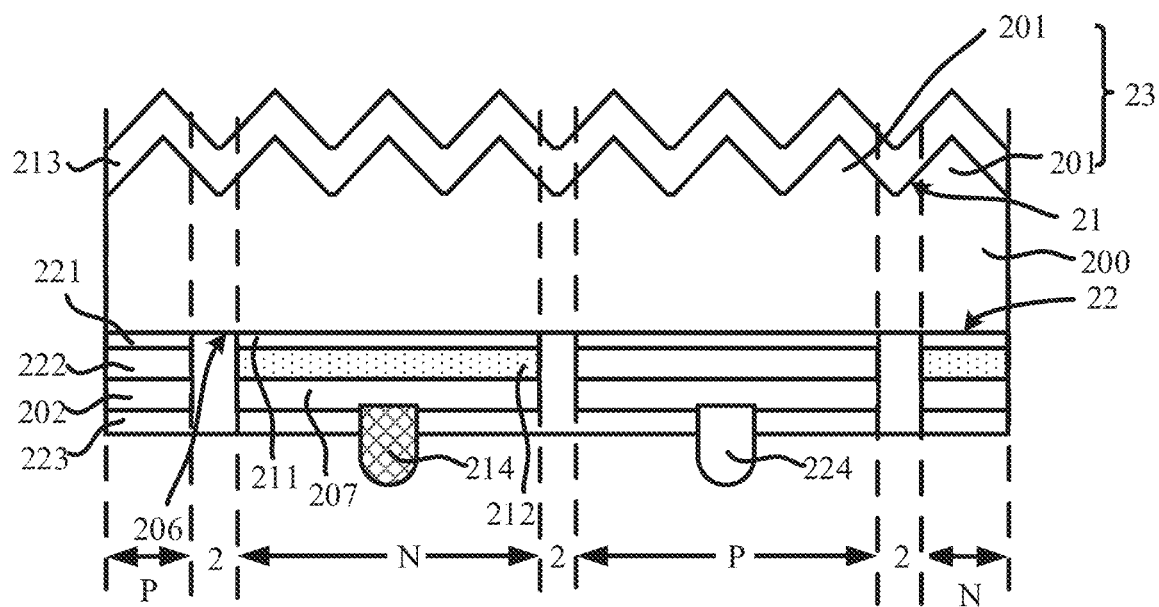
FIG. 6 is a cross-sectional view of FIG. 5 along section line A1-A2.
Figure 7:
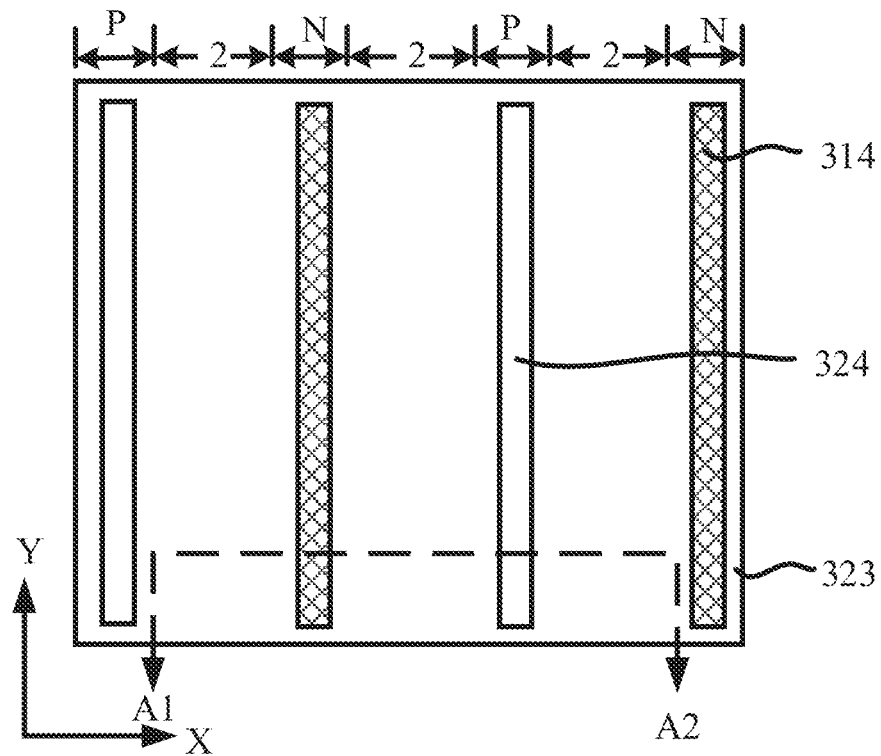
FIG. 7 is yet another schematic structural diagram of a solar cell according to an embodiment of the present disclosure.

FIG. 5 is a schematic structural diagram of a solar cell according to an embodiment of the present disclosure, and FIG. 6 is a schematic cross-sectional view of FIG. 5 along section line A1-A2.

In some embodiments, referring to FIG. 6, the first dielectric layer 211 includes a first intrinsic dielectric layer, and a heterojunction structure is formed between the first intrinsic dielectric layer and the substrate. The first intrinsic dielectric layer has a good passivation effect on the surface of the substrate, recombination of carriers is greatly avoided, and long lifetime of the minority carriers and high open-circuit voltage are achieved.

Referring to FIG. 6, the second dielectric layer 221 includes a second intrinsic dielectric layer, and a heterojunction structure is formed between the second intrinsic dielectric layer and the substrate. The second intrinsic dielectric layer has a good passivation effect on the surface of the substrate, recombination of carriers is greatly avoided, and long lifetime of the minority carriers and high open-circuit voltage are achieved.

The materials of the first intrinsic dielectric layer and the second intrinsic dielectric layer include intrinsic amorphous silicon, intrinsic microcrystalline silicon, intrinsic silicon oxide, intrinsic nanocrystalline silicon or intrinsic silicon carbide. An optional range of a thickness of the first intrinsic dielectric layer is greater than or equal to 2 microns, less than or equal to 10 microns, and preferably 5 microns. An optional range of a thickness of the second intrinsic dielectric layer is greater than or equal to 2 microns, less than or equal to 10 microns, and preferably 5 microns. In some cases, due to the influence of diffusion of other film layers prepared subsequently or doping process conditions, the first intrinsic dielectric layer and the second intrinsic dielectric layer may include a small amount of doping elements, but the intrinsic dielectric layer with a small amount of doping elements is still regarded as a dielectric layer of an intrinsic type.

In some embodiments, a thickness of the first doped polysilicon layer 212 is in a range of 4 nm to 500 nm, and a thickness of the second doped polysilicon layer 222 is in a range of 4 nm to 500 nm. Further, the thickness of the second doped polysilicon layer 222 is in a range of 200 nm to 400 nm. In some embodiments, the thickness of the second doped polysilicon layer 222 is in a range of 20 nm to 103 nm, 103 nm to 139 nm, 139 nm to 161 nm, 161 nm to 218 nm, 218 nm to 298 nm, or 298 nm to 500 nm.

In some embodiments, referring to FIG. 6, the solar cell further includes first transparent conductive layers 207 each formed on a surface of a respective one of the first doped polysilicon layers 212 facing away from the substrate, and second transparent conductive layers 202 each formed on a surface of a respective one of the second doped polysilicon layers 222. The first electrode 214 is in electrical contact with a first transparent conductive layer 207, and the second electrode 224 is in electrical contact with a second transparent conductive layer 202.

In some embodiments, a material of the first transparent conductive layer 207 includes at least one of indium tin oxide (ITO), aluminum doped zinc oxide (AZO), cerium doped indium oxide, and tungsten doped indium oxide, and a material of the second transparent conductive layer 202 includes at least one of indium tin oxide (ITO), aluminum doped zinc oxide (AZO), cerium doped indium oxide, and tungsten doped indium oxide.

For the solar cell shown in FIG. 5, in some embodiments, the first doped polysilicon layer 212 is doped with the doping element of a conductivity type that is different from a conductivity type of the doping element in the substrate 200, a PN junction is formed between the first doped polysilicon layer 212 and the substrate 200, and the first doped polysilicon layer 212 serves as an emitter. In some embodiments, the second doped polysilicon layer 222 is doped with the doping element of a conductivity type that is different from a conductivity type of the doping element in the substrate, a PN junction is formed between the second doped polysilicon layer 222 and the substrate, and the second doped polysilicon layer 222 serves as the emitter. Since the first dielectric layer 211 or the second dielectric layer 221 is an intrinsic dielectric layer, the intrinsic dielectric layer is provided between the PN junction to serve as a buffer layer, and the intrinsic dielectric layer has a good passivation effect on the surface of the substrate 200, so that recombination of carriers is greatly avoided, and relatively long lifetime of the minority carriers and high open-circuit voltage are realized.

With continued reference to FIG. 2 and FIG. 4, the second doped polysilicon layer 122 includes a plurality of second silicon grains 1221, and surfaces of the plurality of second silicon grains 1221 form a surface of the second doped polysilicon layer 122 having a second roughness. A grain size of the first silicon grain 1121 is less than a grain size of the second silicon grain 1221.

In some embodiments, "roughness" in "first roughness" and "second roughness" refers to an arithmetic mean of absolute values of vertical deviations of a crest and a trough relative to an average horizontal line set in a sampling length. The roughness may be measured by comparison measurement, light-sectioning measurement, interference measurement, and stylographic measurement.

In some embodiments, the grain size of the second silicon grain 1221 is in a range of 100 nm to 900 nm. The grain size of the second silicon grain 1221 may be in a range of 100 nm to 250 nm, 250 nm to 360 nm, 360 nm to 490 nm, 490 nm to 584 nm, 584 nm to 610 nm, 610 nm to 790 nm, or 790 nm to 900 nm. When the grain size of the second silicon grain 1221 is within any of the above ranges, a grain boundary between the second silicon grain 1221 and the second silicon grain 1221 is small, and carriers can easily pass through the second doped polysilicon layer 122, thereby improving the carrier migration rate and facilitating the improvement of the cell efficiency.

In some embodiments, the second silicon grain 1221 has a sheet shape, a plate shape, or a granular shape. A microstructure of the second silicon grain shown in FIG. 4 is in the sheet shape.

FIG. 3 and FIG. 4 show surface morphologies of the first doped polysilicon layer 112 and the second doped polysilicon layer 122 at the same magnification, respectively. As is seen from FIG. 3 and FIG. 4, the surface of the first doped polysilicon layer 112 is rougher than the surface of the second doped polysilicon layer 122, that is, the first roughness is greater than the second roughness. In this way, based on different morphologies of the first doped polysilicon layer 112 and the second doped polysilicon layer 122, for the first doped polysilicon layer 112 with higher roughness, the surface of the first doped polysilicon layer 112 improves the internal reflection of incident light and reduces the optical loss of the solar cell. The first doped polysilicon layer 112 further improves the contact area between the first electrode and the first doped polysilicon layer 112, thereby improving the contact performance and the welding tension of the first doped polysilicon layer 112. For the second doped polysilicon layer 122 with lower roughness, the surface of the second doped polysilicon layer 122 is smooth, the uniformity of the second passivation layer deposited on the second doped polysilicon layer 122 is good, and the passivation performance of the second passivation layer is good, so that the problem of recombination defects of the solar cell is improved.

In some embodiments, the grain size of the first silicon grain 1121 being less than the grain size of the second silicon grain 1221 includes that a radial one-dimensional size of the first silicon grain 1121 is smaller than a radial one-dimensional size of the second silicon grain, and a height of the first silicon grain 1121 is greater than a height of the second silicon grain 1221. In this way, the roughness of the first doped polysilicon layer 112 formed by the first silicon grains 1121 is greater than the roughness of the second doped polysilicon layer 122 formed by the second silicon grains 1221.

The radial one-dimensional size of the first silicon grain 1121 refers to a length of an average line (or diameter) of the first silicon grain 1121. The height of the first silicon grain 1121 refers to a distance between a side of the first silicon grain 1121 close to the first dielectric layer 111 and a side of the first silicon grain 1121 away from the first dielectric layer 111.

Similarly, the radial one-dimensional size of the second silicon grain 1221 refers to a length of an average line (or diameter) of the second silicon grain 1221. The height of the second silicon grain 1221 refers to a distance between a side of the second silicon grain 1221 close to the second dielectric layer 121 and a side of the second silicon grain 1221 away from the second dielectric layer 121.

In some embodiments, the first silicon grain 1121 has a granular shape with the same length in three dimensions, and the height of the first silicon grain 1121 is equal to the length of the average line of the first silicon grain 1121. The second silicon grain 1221 has the sheet shape extending in two dimensions, and the height of the second silicon grain 1221 is less than the length of the average line of the second silicon grain 1221. The height of the second silicon grain 1221 is a length of a line in a direction of a non-extending surface.

A size of a grain is referred to as the grain size. Conventional representations include a number of grains per volume (ZV), a number of grains per unit area (ZS), or a length of an average line (or diameter) of the grain. The length of the average line of the grain refers to a length of a line of an extension surface in an extension direction of the grain. The grain size in this embodiment of the present disclosure may be the length of the average line of the grain.

In some embodiments, an average thickness of the first doped polysilicon layer 112 is less than or equal to an average thickness of the second doped polysilicon layer 122. In this way, the average thickness of the first doped polysilicon layer 112 is small, and the doping element in the substrate is easily diffused to the first doped polysilicon layer 112, and is then collected by the first electrode. The second electrode may burn the second doped polysilicon layer 122 to cause the P-type doping element to be diffused into the substrate due to the fact that the second doped polysilicon layer 122 is too thin. The average thickness of the second doped polysilicon layer 122 on the rear surface is large, so that the above risk is reduced, the problem that the P-type doping element in the second doped polysilicon layer 122 is accumulated at the interface of the substrate to form a 'dead layer' is avoided, the carrier transport efficiency is improved, and the generation of the carrier recombination center is reduced.

With continued reference to FIG. 2, the solar cell further includes a passivation layer 123 formed over surfaces of the first doped polysilicon layers 112 facing away from the substrate 100 and surfaces of the second doped polysilicon layers 122 facing away from the substrate 100. First electrodes 114 and second electrodes 124 are formed on a surface of the passivation layer 123, the first electrodes 114 are located in the N-type regions and are electrically connected to the first doped polysilicon layers 112, the second electrodes 124 are located in the P-type regions and are electrically connected to the second doped polysilicon layers 122.

In some embodiments, the solar cell further includes a first passivation layer 113, and the first passivation layer 113 is formed over the front surface 11 of the substrate 100.

In some embodiments, the first passivation layer 113 may be a single-layer structure or a laminated structure, and a material of the first passivation layer 113 includes at least one of silicon oxide, silicon nitride, silicon oxynitride, silicon carbonitride oxide, titanium oxide, hafnium oxide, or aluminum oxide, etc.

In some embodiments, the passivation layer 123 may be a single-layer structure or a laminated structure, and a material of the passivation layer 123 includes at least one of silicon oxide, silicon nitride, silicon oxynitride, silicon carbonitride oxide, titanium oxide, hafnium oxide, or aluminum oxide, etc.

In some embodiments, a distance between a first electrode 114 and a second electrode 124 that are adjacent to each other in a first direction X is in a range of 0.5 mm to 2 mm. The distance between the first electrode 114 and the second electrode 124 in the first direction X is in a range of 0.5 mm to 0.8 mm, 0.8 mm to 1.15 mm, 1.15 mm to 1.28 mm, 1.28 mm to 1.46 mm, 1.46 mm to 1.68 mm, 1.68 mm to 1.84 mm, or 1.84 mm to 2 mm.

In some embodiments, a width of the first electrode 114 in the first direction X or a width of the second electrode 124 in the first direction X is in a range of 5 μm to 50 μm. The width of the first electrode 114 in the first direction X or the width of the second electrode 124 in the first direction X is in a range of 5 μm to 9 μm, 9 μm to 14 μm, 14 μm to 23 μm, 23 μm to 34 μm, 34 μm to 42 μm, 42 μm to 45 μm, 45 μm to 48 μm, or 48 μm to 50 μm.

In some embodiments, the first electrode 114 is sintered from burn-through paste. A method for forming the first electrode 114 includes printing metal paste on a surface of a portion of the passivation layer 123 by using a screen-printing process. The metal paste includes at least one of silver, aluminum, copper, tin, gold, lead, or nickel. Then, a sintering process is performed on the metal paste, and the metal paste has a material of a highly corrosive component such as glass powder, so that the corrosive component corrodes the passivation layer 123 in the sintering process, thereby the metal paste permeates in the passivation layer 123 so as to be in electrical contact with the first doped polysilicon layer 112.

In some embodiments, the second electrode 124 is sintered from burn-through paste. The method for forming the second electrode 124 includes printing metal paste on a surface of a portion of the passivation layer 123 by using a screen-printing process. The metal paste includes at least one of silver, aluminum, copper, tin, gold, lead, or nickel. Then, a sintering process is performed on the metal paste, and the metal paste has a material of a highly corrosive component such as glass powder, so that the corrosive component corrodes the passivation layer 123 in the sintering process, thereby the metal paste permeates in the passivation layer 123 so as to be in electrical contact with the second doped polysilicon layer 122.

Referring to FIG. 6, a method for forming a second electrode 224 includes printing metal paste on a surface of a portion of a passivation layer 223 using a screen-printing process. The metal paste includes at least one of silver, aluminum, copper, tin, gold, lead, or nickel. Then, a sintering process is performed on the metal paste, and the metal paste has a material of a highly corrosive component such as glass powder, so that the corrosive component corrodes the passivation layer 223 in the sintering process, so that the metal paste permeates in the passivation layer 223 so as to be in electrical contact with the second transparent conductive layer 202.

In some examples, as shown in FIG. 2, the substrate is doped with the N-type doping element, and a N-type cell, compared with a P-type cell, has advantages of high conversion rate, low temperature coefficient, high double-sided rate, long lifetime of carriers and the like. The first roughness of the first doped polysilicon layer 112 is large, so that the contact performance of the first doped polysilicon layer 112 and the first electrode is good. The second roughness of the second doped polysilicon layer 122 is small, so that the film layer performance of the second passivation layer deposited on the second doped polysilicon layer 122 is good, the passivation performance of the second passivation layer is improved, and the cell efficiency is further improved.

In the solar cell provided in the embodiments of the present disclosure, the solar cell includes the first doped polysilicon layers 112 and the second doped polysilicon layers 122 formed over the rear surface, such a fully-passivated contact cell structure greatly reduces the recombination current of the cell, and improves the open-circuit voltage of the cell. In addition, the process of preparing the fully-passivated contact cell uses the first doped polysilicon layers 112 and the second doped polysilicon layers 122 as the carrier transport layers without the design of the high-temperature diffusion layer, which removes the influence of the recombination current of the diffusion layer, and improves the open-circuit voltage of the cell. The first doped polysilicon layers 112 are doped with N-type doping elements, and a surface of a first doped polysilicon layer 112 has a first roughness. The second doped polysilicon layers 122 are doped with P-type doping elements, and a surface of a second doped polysilicon layer 122 has a second roughness, and the second roughness is less than the first roughness. In this way, the first doped polysilicon layer 112 and the second doped polysilicon layer 122 have different morphologies, and for the first doped polysilicon layer 112 with higher roughness, the surface of the first doped polysilicon layer 112 improves the internal reflection of incident light and reduces the optical loss of the solar cell. The first doped polysilicon layer 112 further improves the contact area between the first electrode and the first doped polysilicon layer 112, thereby improving the contact performance and the welding tension of the first doped polysilicon layer 112. For the second doped polysilicon layer 122 with lower roughness, the surface of the second doped polysilicon layer 122 is smooth, the uniformity of the second passivation layer deposited on the second doped polysilicon layer 122 is good, and the passivation performance of the second passivation layer is good, so that the problem of recombination defects of the solar cell is improved.

The description of the substrate 200, the first passivation layer 213, the first dielectric layers 211, the first doped polysilicon layers 212, an original textured structure 23, the protrusion structures 201, the first electrodes 214, a front surface 21, and a rear surface 22 in FIG. 6 is able to refer to the description of the substrate 100, the first passivation layer 113, the first dielectric layers 111, the first doped polysilicon layers 112, the original textured structure 13, the protrusion structures 101, the first electrodes 114, the front surface 11, and the rear surface 12 in FIG. 2, which is not repeated herein.

Correspondingly, some embodiments of the present disclosure further provide a solar cell, which differs from the above embodiments in that the rear surface has first surface structures in the P-type regions, each of the second dielectric layers formed on a respective first surface structure, the rear surface has second surface structures in non-electrode regions, and the passivation layer is also formed on the second surface structures. Some of the structures the same as those in the above embodiments are not repeated herein.

Figure 8:
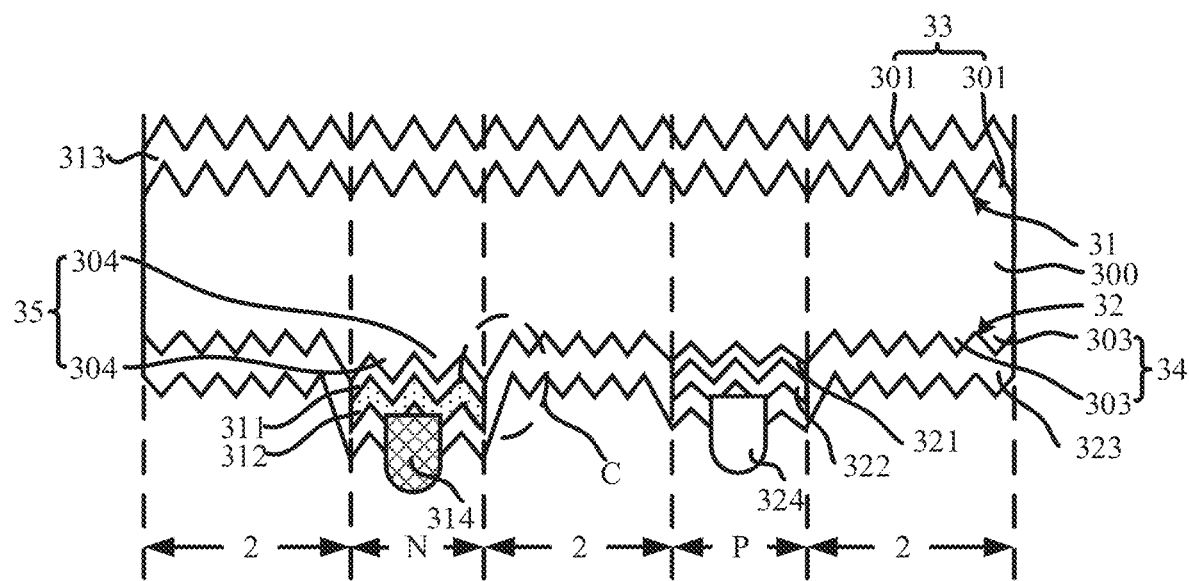
FIG. 8 is a cross-sectional view of FIG. 7 along section line A1-A2.
Figure 9:
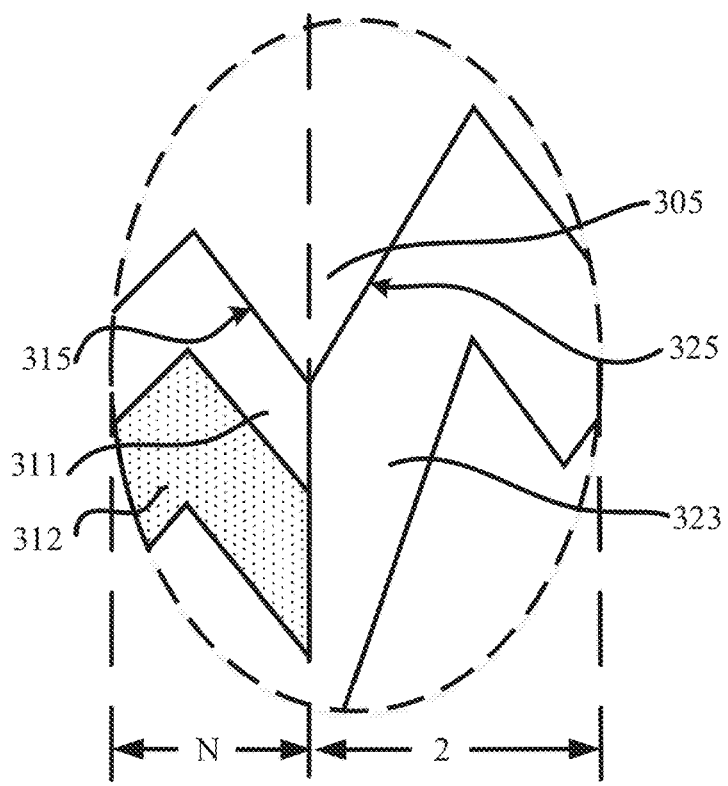
FIG. 9 is a partial enlarged view of part C in FIG. 8.

Referring to FIG. 8 and FIG. 9, a rear surface 32 has a first surface structure 35 in a N-type region and a second surface structure 36 in a non-electrode region 2, a first dielectric layer 311 is formed on the first surface structure 35, and a passivation layer 323 is formed on the second surface structure 34.

In some embodiments, a minimum distance between the first surface structure 35 and a front surface 31 of the substrate is a first minimum distance, a minimum distance between the second surface structure 34 and the front surface 31 is a second minimum distance, and the first minimum distance is less than the second minimum distance.

The minimum distance between the first surface structure 35 and the front surface 31 refers to a distance between a portion of the first surface structure closest to the front surface 31 and the front surface 31. The minimum distance between the second surface structure 34 and the front surface 31 refers to a distance between a portion of the second surface structure closest to the front surface 31 and the front surface 31.

In some embodiments, the rear surface includes the first surface structures, the second surface structures, and textured structures.

In some embodiments, a difference between the first minimum distance and the second minimum distance is in a range of 0.5 μm to 10 μm. The difference between the first distance and the second distance is in a range of 0.5 μm to 2 μm, 2 μm to 3.8 μm, 3.8 μm to 6.9 μm, 6.9 μm to 7.6 μm, 7.6 μm to 8.3 μm, or 8.3 μm to 10 μm.

In some embodiments, the first surface structure includes platform protrusion structures, pyramid textured structures, or a flat surface.

In some embodiments, the first surface structure 35 includes a plurality of first protrusion structures 304 arranged at intervals, and in practical application, the arrangement of the plurality of first protrusion structures 304 is not limited. Since the first dielectric layer 311 and the first doped polysilicon layer 312 are thin, the first dielectric layer 311 and the first doped polysilicon layer 312 are able to show morphologies of the first protrusion structures.

In some embodiments, referring to FIG. 8, the second surface structure 34 includes a plurality of second protrusion structures 303. In practical application, the arrangement of the plurality of second protrusion structures 303 is not limited.

In some embodiments, at least one of the first surface structure 35 and the second surface structure 34 includes platform protrusion structures or pyramid textured structures.

Figure 10:
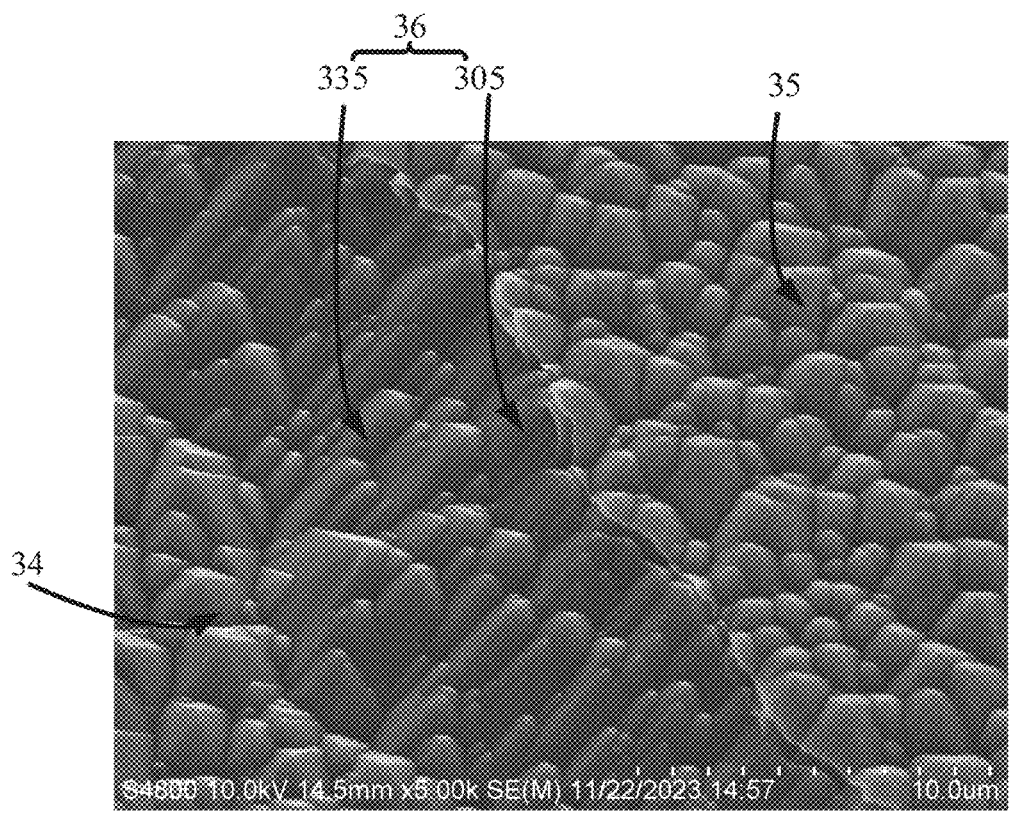
FIG. 10 is a first scanning electron microscope image of a junction of an electrode region and a non-electrode region in FIG. 8.

In some embodiments, referring to FIG. 9 and FIG. 10, the rear surface of the substrate 300 further has third surface structures 36 each located at a junction of the P-type region and the non-electrode region 2 or at a junction of the N-type region and the non-electrode region 2. Some of the third surface structures 36 include a first side surface 315 and a second side surface 325. The first side surface 315 faces away from the non-electrode region 2, and the first dielectric layer 311 covers the first side surface 315. The second side surface 325 faces the non-electrode region 2. The first side surface 315 has a radial length that is less than a radial length of the second side surface 325.

In some embodiments, the third surface structure 36 includes prism structures, pyramid structures, or tetrahedral structures.

Figure 11:
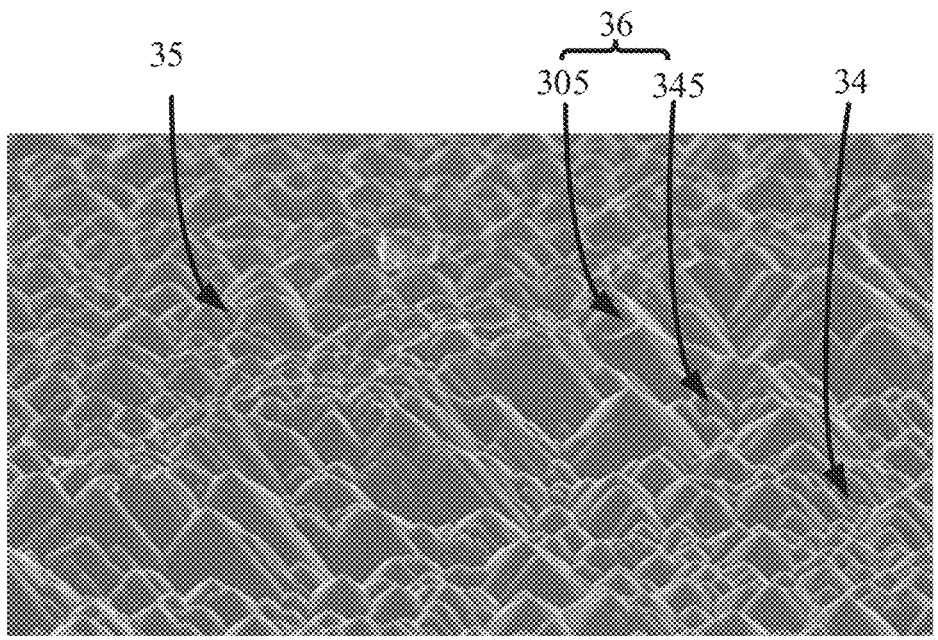
FIG. 11 is a second scanning electron microscope image of the junction of the electrode region and the non-electrode region in FIG. 8.

Referring to FIG. 11, the third surface structure 36 has a plurality of third protrusion structures 305 arranged in an intersecting manner, and the third surface structure 36 further has micro-convex structures 345 in addition to the discrete third protrusion structures 305, so that a probability that incident light incident to the junction of the electrode region and the non-electrode region at different angles is reflected at least once and absorbed by the substrate 300 through the third protrusion structures 305 and/or the micro-convex structures 345 is increased, and a probability that the incident light is reflected at least once and reflected by the third protrusion structures 305 and/or the micro-convex structures 345 to the non-electrode region 2 so as to be absorbed by the non-electrode region 2 is increased, thereby improving the absorption rate of the front surface 31 to the incident light. By improving the problem of serious recombination of carriers in the P-type regions or the N-type regions and improving the absorption rate of the first surface 31 to the incident light, the photoelectric conversion efficiency of the solar cell is improved.

In some embodiments, the third surface structure 36 includes prism structures, pyramid structures, or tetrahedral structures.

The embodiments of the present disclosure are described in more detail below with reference to the accompanying drawings.

In some embodiments, referring to FIG. 11, a micro-convex structure 345 includes at least one of a prism structure inclined toward the N-type region, a second pyramid structure, or a triangular plate-like structure.

It should be noted that, as an example, the micro-convex structure 345 includes the prism structure inclined toward the N-type region, the second pyramid structure or the triangular plate-shaped structure as shown in FIG. 11. In practical application, for the third surface structure 36 in the same region, the micro-convex structure 345 may include only one of the second pyramid structure, the triangular plate-shaped structure, or the prism structure inclined toward the N-type region, or any two of the three. In addition, the micro-convex structure 345 may be an irregular granular structure in addition to one of the prism structure inclined toward the N-type region, the second pyramid structure, or the triangular plate-shaped structure.

Referring to FIG. 11, it should be noted that a one-dimensional size of a bottom of the micro-convex structure 345 includes any one of a length, a width, or a diagonal length of an orthographic projection pattern of the bottom of the micro-convex structure 345 on the substrate 300. In addition, as an example, the orthographic projection pattern of the bottom of the micro-convex structure 345 on the substrate 300 is a regular quadrangle in FIG. 11. In this case, the one-dimensional size of the bottom of the micro-convex structure 345 is any one of a length, a width, or a diagonal length of the regular quadrangle.

In practical application, the orthographic projection pattern of the bottom of the micro-convex structure 345 on the substrate 300 may also be an irregular polygon, and in this case, the length, width or diagonal length of the orthographic projection pattern of the bottom of the micro-convex structure 345 on the substrate 300 is not absolute, but is artificially defined for representing the one-dimensional size of the bottom of the micro-convex structure 345. For example, the orthographic projection pattern of the bottom of the micro-convex structure 345 on the substrate 300 is an irregular quadrangle. In this case, the length of the orthographic projection pattern of the bottom of the micro-convex structure 345 on the substrate 300 may be defined as a length of the longest edge of the irregular quadrangle, the width of the orthographic projection pattern of the bottom of the micro-convex structure 345 on the substrate 300 may be defined as a length of the shortest edge of the irregular quadrangle, and the diagonal length of the orthographic projection pattern of the bottom of the micro-convex structure 345 on the substrate 300 may be defined as a length of the longest diagonal of the irregular quadrangle.

In addition, the orthographic projection pattern of the bottom of the micro-convex structure 345 on the substrate 300 may be, in addition to the irregular quadrangle, other irregular polygons, circles, or irregular shapes similar to a circle. In this case, one-dimensional size of the bottom of the micro-convex structure 345 is measured by selecting a plurality of regions with different specific areas in the bottom of the micro-convex structure 345 and obtaining an average value of lengths, widths, diagonal lengths or diameters of the regions with the different specific areas, where the regions with the specific areas are flexibly defined according to actual requirements.

With continued reference to FIG. 11, it should be noted that the orthographic projection pattern of the bottom of the third protrusion structure 305 on the substrate 300 is generally a regular quadrangle, and in this case, one-dimensional size of the bottom of the third protrusion structure 305 is any one of a length, a width, or a diagonal length of the regular quadrangle. In practical application, the orthographic projection pattern of the bottom of the third protrusion structure 305 on the substrate 300 may be an irregular quadrangle, and the definition of one-dimensional size of the bottom of the third protrusion structure 305 in this case is similar to the definition of one-dimensional size of the orthographic projection pattern of the bottom of the micro-convex structure 345 on the substrate 300 when it is the irregular quadrangle, which is not repeated herein.

In addition, one-dimensional sizes of bottoms of different third protrusion structures 305 may be different or the same, but the one-dimensional sizes of the bottoms of the third protrusion structures 305 are within a numerical range. One-dimensional sizes of bottoms of different micro-convex structures 345 may be different or the same, but the one-dimensional sizes of the bottoms of the third protrusion structures 305 are also within a numerical range. The one-dimensional size of the bottom of the micro-convex structure 345 being smaller than that of the bottom of the third protrusion structure 305 means that an average value of the one-dimensional sizes of the bottoms of the plurality of micro-convex structures 345 is smaller than an average value of the one-dimensional sizes of the bottoms of the plurality of third protrusion structures 305.

Specific characteristics of the prism structures are described in detail below.

In some embodiments, referring to FIG. 11, the prism structures are located on side surfaces of the third protrusion structures 305. The following two arrangements of the prism structures on the side surfaces of the third protrusion structures 305 are provided. In some cases, one prism structure is located on a side surface of one third protrusion structure 305. In other cases, a plurality of prism structures are attached to the same side surface of one third protrusion structure 305, and each prism structure is in contact and connection with the side surface.

In some embodiments, with continued reference to FIG. 11, some of the prism structures are located at a portion of the junction adjacent to the N-type region. For example, the prism structures are located between the third protrusion structures 305 and the N-type region.

In some embodiments, the plurality of prism structures are sequentially arranged in a direction away from the side surface of the third protrusion structure 305. For example, only the prism structure closest to the side surface of the third protrusion structure 305 among the plurality of prism structures is in contact and connection with the side surface of the third protrusion structure 305.

It should be noted that the plurality of prism structures at the same junction include at least one of the prism structures described in the above three kind of embodiments, that is, the plurality of prism structures at the same junction may have the characteristics of the prism structures in the above three kind of embodiments, or have the characteristics of the prism structures in any two of the above three kind of embodiments, or have the characteristics of the prism structures in any one of the above three kind of embodiments.

Specific characteristics of the second pyramid structures are described in detail below.

In some embodiments, a bottom of the second pyramid structure is in contact and connection with the bottom of the third protrusion structure 305. In some cases, a periphery of the bottom of one third protrusion structure 305 is surrounded with a plurality of second pyramid structures, and the bottom of each second pyramid structure is in contact and connection with the bottom of the third protrusion structure 305.

In some embodiments, at least one second pyramid structure is located at the interval between two adjacent third protrusion structures 305. In other words, the bottom of the second pyramid structure is not in contact and connection with the bottom of the third protrusion structure 305.

It should be noted that the second pyramid structures at the same junction include the second pyramid structures in at least one of the above two kind of embodiments, that is, the plurality of second pyramid structures at the same junction may have the characteristics of the second pyramid structures in the above two kind of embodiments, or have the characteristics of the second pyramid structures in any one of the above two kind of embodiments.

Specific characteristics of the triangular plate-like structures are described in detail below.

In some embodiments, one triangular plate-like structure is located on a side surface of one third protrusion structure 305 in some cases, and in other cases, a plurality of triangular plate-like structures are attached to the same side surface of one third protrusion structure 305, and each triangular plate-like structure is in contact and connection with the side surface.

In some embodiments, the plurality of triangular plate-like structures are sequentially arranged in a direction away from the side surface of the third protrusion structure 305. For example, only the triangular plate-like structure closest to the side surface of the third protrusion structure 305 among the plurality of triangular plate-like structures is in contact and connection with the side surface of the third protrusion structure 305.

It should be noted that the triangular plate-like structures at the same junction include the triangular plate-like structures in at least one of the above two kind of embodiments, that is, the plurality of triangular plate-like structures at the same junction may have the characteristics of the triangular plate-like structures in the above two kind of embodiments, or have the characteristics of the triangular plate-like structures in any one of the above two kind of embodiments.

In some embodiments, the third protrusion structure 305 is located at a portion of the junction adjacent to the non-electrode region 2. In other words, there are more typical third protrusion structures 305 at the portion of the junction adjacent to the non-electrode region 2.

It should be noted that, the third surface structures 36 at the junction are described in various embodiments, i.e., the structure of the third surface structure 36 has diversity. In some cases, the plurality of micro-convex structures 345 are also provided at the same junction at which the third protrusion structures 305 are provided, and the specific characteristics of the plurality of micro-convex structures 345 at different junctions may be different. For example, one of two adjacent junctions has the prism structures inclined toward the N-type region and the second pyramid structures, and the other has the second pyramid structures and the triangular plate-like structures.

Referring to FIG. 10, the third surface structure 36 further includes first prism structures 335, a first length of a third protrusion structure 305 is greater than a second length of a first prism structure 335 in an inclined direction of the first prism structure 335, and at least some of the first prism structures 335 are located on side surfaces of the third protrusion structures 305 away from the N-type region. In this way, the probability that the incident light incident to the junction is absorbed by the junction or the non-electrode region 2 is further improved.

It should be noted that in the example shown in FIG. 10, an inclined length of the shortest one of the plurality of third protrusion structures 305 is defined as the first length of the third protrusion structure 305, and an inclined length of the longest one of the plurality of first prism structures 335 is defined as the second length of the first prism structure 335. Based on this, the first length of the third protrusion structure 305 being greater than the second length of the first prism structure 335 refers to that the inclined length of the shortest one of the plurality of third protrusion structures 305 is greater than the inclined length of the longest one of the plurality of first prism structures 335.

In practical application, an average value of inclined lengths of the plurality of third protrusion structures 305 is defined as the first length of the third protrusion structure 305, and an average value of inclined lengths of the plurality of first prism structures 335 is defined as the second length of the first prism structure 335. Based on this, the first length of the third protrusion structure 305 being greater than the second length of the first prism structure 335 refers to that the average value of the inclined lengths of the plurality of third protrusion structures 305 is greater than the average value of the inclined lengths of the plurality of first prism structures 335.

In some embodiments, referring to FIG. 10, two arrangements of the second prism structures 335 on the side surfaces of the third protrusion structures 305 away from the N-type region are provided. In some cases, one second prism structure 335 is located on a side surface of one third protrusion structure 305 away from the N-type region. In some cases, the plurality of first prism structures 335 are located on a side surface of one second prism structure 335 away from the N-type region, and each first prism structure 335 is in contact and connection with the side surface.

In some embodiments, referring to FIG. 10, the plurality of first prism structures 335 are sequentially arranged in a direction away from the side surface of the third protrusion structure 305. For example, only the first prism structure 335 closest to the side surface of the third protrusion structure 305 among the plurality of first prism structures 335 is in contact and connection with the side surface of the third protrusion structure 305.

In some embodiments, referring to FIG. 10, the third surface structure 36 further includes first pyramid structures, and at least some of the first pyramid structures are located on a portion of the junction.

A one-dimensional size of a bottom of the third protrusion structure is greater than a one-dimensional size of a bottom of the first protrusion structure, and the one-dimensional size of the bottom of the first protrusion structure is greater than a one-dimensional size of a bottom of the second protrusion structure.

It should be noted that the definitions for both the one-dimensional size of the bottom of the first protrusion structure and the one-dimensional size of the bottom of the second protrusion structure are similar to the definition for the one-dimensional size of the bottom of the third protrusion structure described in the above embodiments of the present disclosure, and details are not repeated herein.

In addition, one-dimensional sizes of bottoms of different first protrusion structures may be different or the same, but the one-dimensional sizes of the bottoms of the first protrusion structures are within a numerical range. One-dimensional sizes of bottoms of different second protrusion structures may be different or the same, but the one-dimensional sizes of the bottoms of the second protrusion structures are also within a numerical range. Based on this, the one-dimensional size of the bottom of the third protrusion structure being greater than that of the bottom of the first protrusion structure refers to that an average value of the one-dimensional sizes of the bottoms of the plurality of third protrusion structures is greater than an average value of the one-dimensional sizes of the bottoms of the first protrusion structures, and the one-dimensional size of the bottom of the first protrusion structure is greater than that of the bottom of the second protrusion structure refers to that an average value of the one-dimensional sizes of the bottoms of the plurality of first protrusion structures on which the first doped polysilicon layers are formed is greater than an average value of the one-dimensional sizes of the bottoms of the plurality of second protrusion structures in the non-electrode regions 2.

Moreover, a size relationship between the one-dimensional size of the bottom of the second protrusion structure and the one-dimensional size of the bottom of the second protrusion structure is not limited in the embodiments of the present disclosure.

Correspondingly, some embodiments of the present disclosure further provide a method for preparing a solar cell, which may be used to prepare the solar cell provided in the above embodiments, and technical features the same as or corresponding to the technical features in the above embodiments are not repeated herein.

The method for preparing the solar cell shown in FIG. 8 is taken as an example.

The method includes providing an initial substrate having a first surface and a second surface opposite to each other, and the initial substrate is doped with an N-type doping element or a P-type doping element.

In some embodiments, polishing treatment is performed on two opposite surfaces of the initial substrate, and the polishing treatment is used to reduce surface defects of the substrate.

In some embodiments, the initial substrate has first regions and second regions that are spaced from each other and alternatingly arranged as well as initial non-electrode regions each provided between a first region and a second region adjacent to each other.

The method includes performing texturing treatment on the second surface of the initial substrate, so that the second surface of the initial substrate forms a textured structure. The texturing treatment includes chemical etching, for example, a mixed solution of potassium hydroxide and hydrogen peroxide may be used to clean the initial substrate, and specifically, the textured structure conforming to the expectation can be formed by controlling a ratio of concentration of the potassium hydroxide solution to concentration of the hydrogen peroxide solution. In some embodiments, the textured structure may also be formed by methods such as laser etching, mechanical or plasma etching. In the laser etching, the textured structure conforming to the expectation is obtained by controlling laser process parameters.

The method includes forming a first initial dielectric layer and a first semiconductor layer stacked on the first surface. The first initial dielectric layer is formed in the first regions, the second regions and the initial non-electrode regions, and the first semiconductor layer is formed on a surface of the first initial dielectric layer facing away from the initial substrate. A surface of the first semiconductor layer facing away from the first initial dielectric layer has a first initial roughness.

In some embodiments, the first semiconductor layer is patterned, portions of the first initial dielectric layer in the first regions are reserved as first dielectric layers, portions of the first semiconductor layer in the first regions are reserved as first doped polysilicon layers, and a surface of a first doped polysilicon layer facing away from the initial substrate has a first roughness. After the patterning, the first regions, second regions and initial non-electrode regions are respectively N-type regions, P-type regions and non-electrode regions, the initial substrate is a substrate, the first surface of the initial substrate serves as a rear surface, and the second surface of the initial substrate serves as a front surface.

In some embodiments, the initial substrate has a first surface structure. At least one of a junction of the first region and the initial non-electrode region and a junction of the second region and the initial non-electrode region has an initial transition region, and the first surface structure is located in the first region, the second region, the initial non-electrode region and the initial transition region. In the patterning process, portions of the first initial semiconductor layer and portions of the first semiconductor layer in the initial non-electrode regions, the second regions, and the initial transition regions are removed, and a part of the initial substrate having a specific thickness is etched to convert portions of the first surface structure in the initial non-electrode regions into second surface structures and portions of the first surface structure in the initial transition regions into textured structures. Some of the textured structures include a first side surface and a second side surface, the first side surface faces away from the non-electrode region, and the second side surface faces the non-electrode region. A radial length of the first side surface is less than a radial length of the second side surface.

In some embodiments, the first surface structures are prepared with the textured structures in the same preparation process, that is, both the first surface and the second surface of the initial substrate are textured.

The method includes forming second dielectric layers and second doped polysilicon layers over the rear surface. Each second dielectric layer is formed in a second region and on a surface of a second dielectric layer facing away from the substrate, and a surface of the second doped polysilicon layer facing away from the substrate has a second roughness. The second roughness is less than the first roughness.

In some embodiments, the first semiconductor layer and the second doped polysilicon layers may be crystallized simultaneously, and in this process, a surface of the first semiconductor layer facing away from the substrate has a first roughness, and a surface of the second doped polysilicon layer facing away from the substrate has a second roughness.

In some embodiments, the crystallization process includes annealing or laser activation.

In some embodiments, before performing the patterning process, the method further includes forming mask layers on portions of the surface of the first semiconductor layer in the first regions, so as to reduce etching damage to the first doped polysilicon layers in the patterning process. A material of the mask layer includes organic wax, metal, or a silicon dioxide mask. The mask layer is formed by using a printing process.

In some embodiments, after the first doped polysilicon layers are formed, the mask layer may be removed by using an etching process, and the etching process includes any one of a dry etching process, a wet etching process, or a laser etching process.

In some embodiments, the patterning process includes a wet etching process or a laser etching process. The process parameters of the wet etching process include a reaction solution including an acid solution, and a reaction time in a range of 50 s to 550 s.

In some embodiments, the steps of the wet etching process include (1) using a mixed acid solution containing HF, $HNO_3$, $H_2SO_4$, with mass concentration of 10% to 25%, 5% to 10%, and 2% to 4%, respectively, patterning the surface in the non-metal regions using the mixed acid solution in a screen printing manner with an amount of 0.05 $ml/cm^2$ to 0.8 $mL/cm^2$ and a time for 50 s to 550 s; (2) using deionized water/low-concentration alkali solution (0.5% to 1% NaOH)/low-concentration HCl (2.5% to 3.5%) for alternate cleaning for 2 times after the patterning.

The method includes forming a passivation layer over surfaces of the first doped polysilicon layers and surfaces of the second doped polysilicon layers, and the passivation layer is further formed over the non-electrode regions.

The method includes forming first electrodes and second electrodes on the surface of the passivation layer facing away from the substrate, the first electrodes are located in the N-type regions and electrically connected to the first doped polysilicon layers, and the second electrodes are located in the P-type regions and electrically connected to the second doped polysilicon layers.

Figure 12:
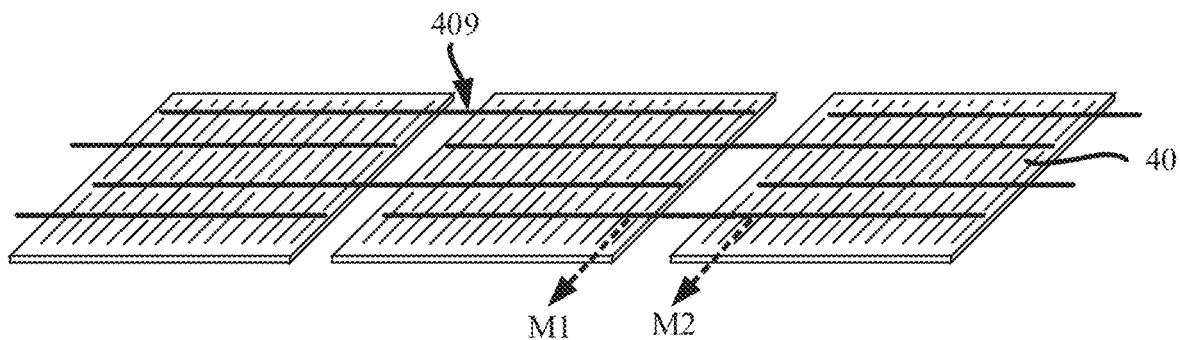
FIG. 12 is a schematic structural diagram of a photovoltaic module according to an embodiment of the present disclosure.
Figure 13:
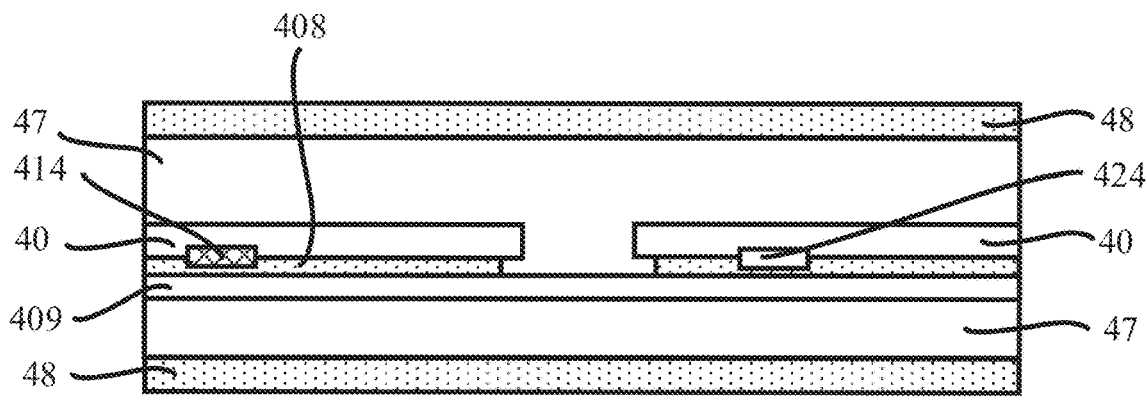
FIG. 13 is a cross-sectional view of FIG. 12 along section line M1-M2.

FIG. 12 is a schematic structural diagram of a photovoltaic module according to an embodiment of the present disclosure. FIG. 13 is a cross-sectional view of FIG. 12 along section line M1-M2.

Correspondingly, some embodiments of the present disclosure provide a photovoltaic module including the solar cell in the above embodiments, and the same parts as those in the above embodiments are not repeated herein.

Referring to FIG. 12, the photovoltaic module includes at least one cell string each formed by connecting a plurality of solar cells 40 according to any one of the above embodiments or a plurality of solar cells prepared by the method according to any one of the above embodiments through at least one connecting member 409, at least one encapsulation layer 47 each configured to cover a surface of a respective cell string, and at least one cover plate 48 each configured to cover a surface of a respective encapsulation layer 47 facing away from the cell string.

Specifically, in some embodiments, the plurality of solar cells are electrically connected by means of the at least one connecting member 409, and the connecting members 409 are welded to busbars 408 on the solar cells.

In some embodiments, a gap is not provided between the solar cells, that is, the solar cells overlap with each other.

In some embodiments, the at least one connection member is welded to finger electrodes on the solar cells, and the finger electrodes include first electrodes 414 and second electrodes 424.

In some embodiments, the at least one encapsulation layer includes a first encapsulation layer and a second encapsulation layer, the first encapsulation layer covers one of the front surface or the rear surface of the solar cell, and the second encapsulation layer covers the other of the front surface or the rear surface of the solar cell. Specifically, at least one of the first encapsulation layer or the second encapsulation layer may be an organic encapsulation adhesive film such as polyvinyl butyral (PVB) adhesive film, ethylene-vinyl acetate copolymer (EVA) adhesive film, polyethylene octene co-elastomer (POE) adhesive film or polyethylene terephthalate (PET) adhesive film.

It should be noted that the first encapsulation layer and the second encapsulation layer have a boundary before lamination processing, and the photovoltaic module formed after the lamination processing does not have the so-called first encapsulation layer and second encapsulation layer, that is, the first encapsulation layer and the second encapsulation layer have formed an integral encapsulation layer 47.

In some embodiments, the at least one cover plate 48 may be a cover plate having a light-transmitting function, such as a glass cover plate and a plastic cover plate. Specifically, a surface of the cover plate 48 facing the encapsulation layer 47 may be a concave-convex surface, thereby increasing the utilization rate of incident light. The at least one cover plate 48 includes a first cover plate and a second cover plate, the first cover plate faces the first encapsulation layer and the second cover plate faces the second encapsulation layer, or, the first cover plate faces one side of the solar cell and the second cover plate faces the other side of the solar cell.

Any person of ordinary skill in the art can understand that the above embodiments are specific embodiments for realizing the present disclosure. In practical application, various changes may be made thereto in form and details without departing from the scope of the present disclosure. Any person skilled in the art may make various changes and modifications without departing from the scope of the present disclosure, and therefore the protection scope of the present disclosure shall be subject to the scope defined in the claims.

What is claimed is:

1. A solar cell, comprising:
   a substrate having a front surface and a rear surface opposite to each other, wherein the rear surface includes P-type regions and N-type regions which are spaced from each other and alternatingly arranged;
   first dielectric layers, wherein each of the first dielectric layers is formed over a respective N-type region of the N-type regions;
   first doped polysilicon layers, wherein each of the first doped polysilicon layers is formed on a respective first dielectric layer of the first dielectric layers and doped with an N-type doping element;
   second dielectric layers, wherein each of the second dielectric layers is formed over a respective P-type region of the P-type regions;
   second doped polysilicon layers, wherein each of the second doped polysilicon layers is formed on a respective second dielectric layer of the second dielectric layers and doped with a P-type doping element, and wherein each of the first doped polysilicon layers has a surface facing away from the substrate and having a first roughness, each of the second doped polysilicon layers has a surface facing away from the substrate and having a second roughness, and the second roughness is less than the first roughness;
   a passivation layer formed over surfaces of the first doped polysilicon layers facing away from the substrate and surfaces of the second doped polysilicon layers facing away from the substrate; and
   first electrodes and second electrodes, wherein each of the first electrodes penetrates the passivation layer and is electrically connected to a respective first doped polysilicon layer, and each of the second electrodes penetrates the passivation layer and is electrically connected to a respective second doped polysilicon layer.

2. The solar cell according to claim 1, wherein the respective first doped polysilicon layer includes a plurality of first silicon grains, and surfaces of the plurality of first silicon grains form a surface of the respective first doped polysilicon layer having the first roughness; wherein the respective second doped polysilicon layer includes a plurality of second silicon grains, and surfaces of the plurality of second silicon grains form a surface of the respective second doped polysilicon layer having the second roughness; and wherein each of the plurality of first silicon grains has a grain size that is less than a grain size of any of the plurality of second silicon grains.

3. The solar cell according to claim 2, wherein the grain size of each of the plurality of first silicon grains is in a range of 10 nm to 300 nm.

4. The solar cell according to claim 2, wherein the grain size of each of the plurality of second silicon grains is in a range of 100 nm to 900 nm.

5. The solar cell according to claim 2, wherein the plurality of first silicon grains have spherical granular shapes or spheroidal granular shapes.

6. The solar cell according to claim 2, wherein the plurality of second silicon grains have sheet shapes, plate shapes, or granular shapes.

7. The solar cell according to claim 2, wherein each of the plurality of first silicon grains has a radial one-dimensional size that is less than a radial one-dimensional size of any of the plurality of the second silicon grains, and each of the plurality of first silicon grains has a height that is greater than a height of any of the plurality of second silicon grains.

8. The solar cell according to claim 1, wherein the rear surface further includes non-electrode regions each provided between a respective P-type region and a respective N-type region that are adjacent to each other, and the passivation layer is formed over the non-electrode regions; wherein the rear surface has first surface structures in the N-type regions, and the first dielectric layers formed on the first surface structures; and wherein the rear surface has second surface structures at the non-electrode regions, and the passivation layer is formed on the second surface structures.

9. The solar cell according to claim 1, wherein the rear surface further includes non-electrode regions each provided between a respective P-type region and a respective N-type region that are adjacent to each other, and the passivation layer is formed over the non-electrode regions; wherein the rear surface has first surface structures in the P-type regions, and the second dielectric layers formed on the first surface structures; and wherein the rear surface has second surface structures in the non-electrode regions, and the passivation layer is formed on the second surface structures.

10. The solar cell according to claim 8, wherein a respective one of the first surface structures and the front surface have a first minimum distance, a respective one of the second surface structures and the front surface have a second minimum distance, and the first minimum distance is less than the second minimum distance.

11. The solar cell according to claim 10, wherein the first minimum distance and the second minimum distance have a difference in a range of 0.5 μm to 10 μm.

12. The solar cell according to claim 8, wherein the rear surface further has third surface structures each located at a junction of the respective P-type region and a respective non-electrode region of the non-electrode regions or a junction of the respective N-type region and the respective non-electrode region; wherein some of the third surface structures include a first side surface and a second side surface, the first side surface faces away from the respective non-electrode region, and the second side surface faces the respective non-electrode region; and wherein the first side surface has a radial length that is less than a radial length of the second side surface.

13. The solar cell according to claim 12, wherein the third surface structures include prism structures, pyramid structures, or tetrahedral structures.

14. The solar cell according to claim 8, wherein the first surface structures include platform protrusion structures, pyramid textured structures, or flat surfaces.

15. The solar cell according to claim 1, wherein the respective first doped polysilicon layer has an average thickness that is less than or equal to an average thickness of the respective second doped polysilicon layer.

16. The solar cell according to claim 1, wherein at least one of a respective one of the first dielectric layers and a respective one of the second dielectric layers includes silicon oxide, amorphous silicon, microcrystalline silicon, nanocrystalline silicon or silicon carbide.

17. A method for preparing a solar cell, comprising:
providing a substrate having a front surface and a rear surface opposite to each other, wherein the rear surface includes P-type regions and N-type regions which are spaced from each other and alternatingly arranged;
forming first dielectric layers, wherein each of the first dielectric layers is formed over a respective N-type region of the N-type regions;
forming first doped polysilicon layers, wherein each of the first doped polysilicon layers is formed on a respective first dielectric layer of the first dielectric layers and doped with a N-type doping element;
forming second dielectric layers, wherein each of the second dielectric layers is formed over a respective P-type region of the P-type regions;
forming second doped polysilicon layers, wherein each of the second doped polysilicon layers is formed on a respective second dielectric layer of the second dielectric layers and doped with a P-type doping element, and wherein each of the first doped polysilicon layers has a surface facing away from the substrate and having a first roughness, each of the second doped polysilicon layers has a surface facing away from the substrate and having a second roughness, and the second roughness is less than the first roughness;
forming a passivation layer over surfaces of the first doped polysilicon layers facing away from the substrate and surfaces of the second doped polysilicon layers facing away from the substrate; and
forming first electrodes and second electrodes, wherein each of the first electrodes penetrates the passivation layer and is electrically connected to a respective first doped polysilicon layer, and each of the second electrodes penetrates the passivation layer and is electrically connected to a respective second doped polysilicon layer.

18. A photovoltaic module, comprising:
at least one cell string each formed by connecting a plurality of solar cells through at least one connecting member;
at least one encapsulation layer each configured to cover a surface of a respective cell string; and
at least one cover plate each configured to cover a surface of a respective encapsulation layer facing away from the respective cell string; wherein each of the plurality of solar cells includes;

a substrate having a front surface and a rear surface opposite to each other, wherein the rear surface includes P-type regions and N-type regions which are spaced from each other and alternatingly arranged;

first dielectric layers, wherein each of the first dielectric layers is formed over a respective N-type region of the N-type regions;

first doped polysilicon layers, wherein each of the first doped polysilicon layers is formed on a respective first dielectric layer of the first dielectric layers and doped with an N-type doping element;

second dielectric layers, wherein each of the second dielectric layers is formed over a respective P-type region of the P-type regions;

second doped polysilicon layers, wherein each of the second doped polysilicon layers is formed on a respective second dielectric layer of the second dielectric layers and doped with a P-type doping element, and wherein each of the first doped polysilicon layers has a surface facing away from the substrate and having a first roughness, each of the second doped polysilicon layers has a surface facing away from the substrate and having a second roughness, and the second roughness is less than the first roughness;

a passivation layer formed over surfaces of the first doped polysilicon layers facing away from the substrate and surfaces of the second doped polysilicon layers facing away from the substrate; and first electrodes and second electrodes, wherein each of the first electrodes penetrates the passivation layer and is electrically connected to a respective first doped polysilicon layer, and each of the second electrodes penetrates the passivation layer and is electrically connected to a respective second doped polysilicon layer.

19. The photovoltaic module according to claim 18, wherein the respective first doped polysilicon layer includes a plurality of first silicon grains, and surfaces of the plurality of first silicon grains form a surface of the respective first doped polysilicon layer having the first roughness; wherein the respective second doped polysilicon layer includes a plurality of second silicon grains, and surfaces of the plurality of second silicon grains form a surface of the respective second doped polysilicon layer having the second roughness; and wherein each of the plurality of first silicon grains has a grain size that is less than a grain size of any of the plurality of second silicon grains.

20. The photovoltaic module according to claim 19, wherein the grain size of each of the plurality of first silicon grains is in a range of 10 nm to 300 nm.

\* \* \* \* \*